United States Patent
Shiraishi

(10) Patent No.: US 6,941,023 B2
(45) Date of Patent: Sep. 6, 2005

(54) IMAGE DATA COMPRESSION APPARATUS FOR COMPRESSING BOTH BINARY IMAGE DATA AND MULTIPLE VALUE IMAGE DATA

(75) Inventor: Naoto Shiraishi, Tokyo (JP)

(73) Assignee: Ricoh Company, Ltd., Tokyo (JP)

(*) Notice: Subject to any disclaimer, the term of this patent is extended or adjusted under 35 U.S.C. 154(b) by 709 days.

(21) Appl. No.: 10/100,776

(22) Filed: Mar. 19, 2002

(65) Prior Publication Data

US 2003/0053701 A1 Mar. 20, 2003

(30) Foreign Application Priority Data

Mar. 21, 2001 (JP) ........................................ 2001-081628

(51) Int. Cl.[7] .............................. G06K 9/36; G06K 9/46
(52) U.S. Cl. ........................................ 382/245; 382/238
(58) Field of Search ................................ 382/232, 238, 382/239, 244, 245, 251; 375/240.02, 240.03, 240.12; 341/59

(56) References Cited

U.S. PATENT DOCUMENTS

| | | | | |
|---|---|---|---|---|
| 5,859,931 A | * | 1/1999 | Fan et al. | 382/238 |
| 5,878,168 A | * | 3/1999 | Kondo et al. | 382/232 |
| 6,061,474 A | * | 5/2000 | Kajiwara et al. | 382/238 |
| 6,343,157 B1 | * | 1/2002 | Yada | 382/246 |
| 6,529,633 B1 | * | 3/2003 | Easwar et al. | 382/239 |
| 6,636,642 B1 | * | 10/2003 | Yokose | 382/238 |
| 6,654,419 B1 | * | 11/2003 | Sriram et al. | 375/240.12 |
| 6,654,503 B1 | * | 11/2003 | Sudharsanan et al. | 382/244 |
| 6,832,004 B2 | * | 12/2004 | So et al. | 382/238 |
| 2001/0007595 A1 | * | 7/2001 | Mishima | 382/232 |

FOREIGN PATENT DOCUMENTS

| | | | | |
|---|---|---|---|---|
| JP | 9-65147 | 3/1997 | ......... | H04N/1/419 |
| JP | 10285405 | 10/1998 | ......... | H04N/1/41 |
| JP | 2000217005 | 8/2000 | ......... | H04N/1/419 |

* cited by examiner

Primary Examiner—Andrew W. Johns
Assistant Examiner—Amir Alavi
(74) Attorney, Agent, or Firm—Cooper & Dunham LLP

(57) ABSTRACT

An image data compression apparatus which compresses code data obtained by compressing image data by a fixed length encoding method so as to reduce a scale of hardware and reduce a development cost of software for an image data compression a binary image data processing part processes binary image data in accordance with a run length encoding method, the binary image data processing part including an encoding part which encodes run lengths of the binary image data by an encoding part. A multiple value image data processing part processes multiple value image data in accordance with a prediction encoding method. The encoding part of the binary image data processing part is commonly used by the multiple image data processing part so that the encoding part compresses both the binary image data and the multiple value image data.

5 Claims, 33 Drawing Sheets

```
La=(Lmax+Lmin)/2
Ld=(Lmax+Lmin)/2
Pi=La+1/2Ld-(i-1)Ld      (i=1~2)
Qj=La+3/4Ld-1/2(j-1)Ld   (j=1~4)

for(i=0..3){
  for(j=0..3){
      if(Lij>=P1)         Φij=11
      else if(Lij>=La) Φij=10
      else if(Lij>=P2) Φij=00
      else                Φij=01
```

FIG.3 PRIOR ART
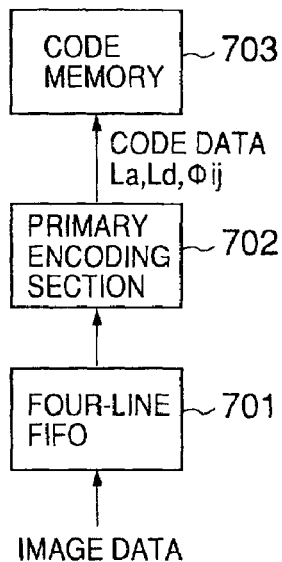
FIG.4 PRIOR ART
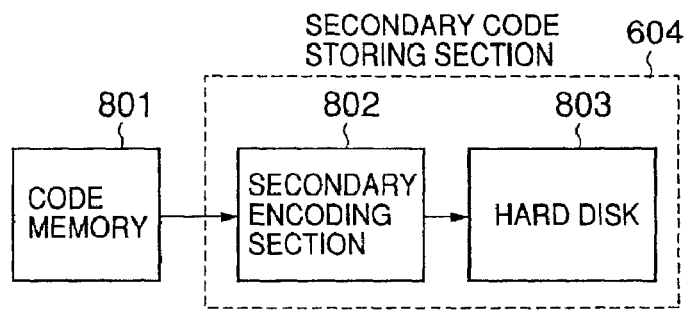
FIG.5 PRIOR ART
$L_a$ ⟶ VARIABLE LENGTH ENCODING OF $\Delta L$
$L_d$ ⟶ VARIABLE LENGTH ENCODING
$\Phi_{ij}(1)$ ⟶ MMR
$\Phi_{ij}(0)$ ⟶ MMR

FIG.15

| LA0 | LD0 | LA1 | LD1 | LA2 | LD2 | LA3 | LD3 |
|-----|-----|-----|-----|-----|-----|-----|-----|

| LA4 | LD4 | LA5 | LD5 | LA6 | LD6 | LA7 | LD7 |
|-----|-----|-----|-----|-----|-----|-----|-----|

| PIXEL CODE0 | PIXEL CODE1 | PIXEL CODE2 | PIXEL CODE3 |
|-------------|-------------|-------------|-------------|

| PIXEL CODE4 | PIXEL CODE5 | PIXEL CODE6 | PIXEL CODE7 |
|-------------|-------------|-------------|-------------|

FIG.37

(a) 3/8 GBTC

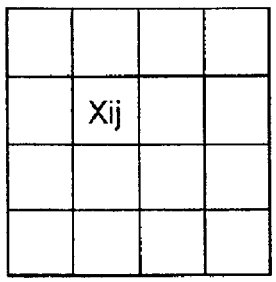

(b) 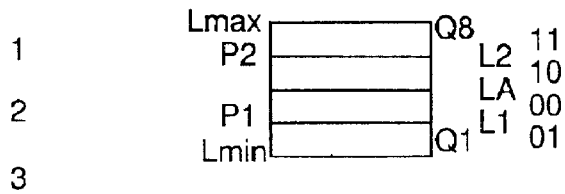

$X_{ij}$: PIXEL DATA ($ij=1\sim4$)
LA : AVERAGE LEVEL OF BLOCK
Lmax : MAX. LEVEL IN BLOCK
Lmin : MIN. LEVEL IN BLOCK
LD : GRADATION WIDTH INDEX IN BLOCK
$\Phi_{ij}$: QUANTIZED LEVEL OF EACH PIXEL (c) ENCODE P1= (Lmax+3Lmin) /4
P2= (3Lmax+Lmin) /4
Q1= ($X_{ij}$<=P1) AVERAGE
Q8= ($X_{ij}$>P2) AVERAGE
LA= (Q1+Q4) /2
LD= Q4-Q1
L1= LA-LD/4
L2= LA-2LD/4

GRADATION
WIDTH INDEX : $\Phi$(2bit)

$X_{ij}$<=L1  $\Phi_{ij}$=01 (BINARY)
L1<$X_{ij}$<=LA  $\Phi_{ij}$=00
LA<$X_{ij}$<=L2  $\Phi_{ij}$=10
$X_{ij}$>L2  $\Phi_{ij}$=11

(d) DECODE

DATA0= LA-LD/2
DATA1= LA-LD/6
DATA2= LA-LD/6
DATA3= LA-LD/2

3/6 GBTC PROCESS

IMAGE DATA COMPRESSION APPARATUS FOR COMPRESSING BOTH BINARY IMAGE DATA AND MULTIPLE VALUE IMAGE DATA

BACKGROUND OF THE INVENTION

1. Field of the Invention

The present invention relates to image processing apparatuses for compressing and decompressing digital data or binary image data and, more particularly, to an image processing apparatus such as a digital copy machine, a scanner or a printer, which uses an encoding and decoding system appropriate for a memory saving mechanism to save a frame buffer capacity.

2. Description of the Related Art

An image data compression technique is generally used in an image processing field so as to reduce a capacity of a memory for storing image data, or reduce a transmission time of image data. Various approaches are used for image data compression according to processing mode of the image data. When carrying out a printing process of image data, it is required to perform a high speed process such as printing an image after rotating the image on a memory having a limited capacity. For this reason, a fixed length compression method is used in many cases. GBTC (Generalized Block Truncation Coding) is known as a typical fixed length compression method.

Japanese Laid-Open Patent Application No. 10-285405 discloses a reference technique relevant to such a coding method. The conventional image data coding apparatus and image data coding method is applicable to a digital copy machine that handles image data as a digital signal. Such a digital copy machine reads image by a scanner, converts the read image data into a digital signal by an A/D converter, applies image processing such as a gamma conversion or an image-quality correction to the digital signal by an image processing part, and outputs an image by printing the image data on a record paper by an image output part.

The digital copy machine can store image data in a memory. Therefore, the image data stored in the memory can be used repeatedly. Moreover, processing and edit of image data such a rotation of an image can be performed by changing input and output addresses. Furthermore, a large amount of image data can be stored by encoding the image data and storing the encoded image data in a secondary memory unit such as a hard disk. It is also possible to output the image data after sorting.

However, there is a large amount of information of an image, and if the image information is stored in a memory as it is, a large memory capacity is needed. Since the unit price of a memory is high, a whole cost must become comparatively high and must use a large hard disk. Therefore, a cost of a memory and a hard disk is reduced by reducing a required memory capacity by storing compressed image data in a memory or a hard disk. A block encoding method, which is an image data compression method, compresses image data by decomposing the image data on an individual block basis. Intensity values Lij in one block are compressed by being converted by an algorithm show in FIG. 1 into an average value La (1 byte), a gradation width index Ld (1 byte) and quantization code $\phi ij$ (2 bits×16) for each pixel.

By this encoding method, an amount of data of 16 bytes of a 4×4-pixel block composed of 1-byte pixels is converted into 6 bytes, and the amount of data is compressed into three eighths of the amount of the original data. Qj is a quantization representation value at the time of decoding, and is a concentration value to which each code is assigned at the time of decoding. FIG. 2 is a block diagram of a digital copy machine having a function to compress and store image data in a memory and to store the encoded image data further in a hard disk. In a case of a normal image output, the digital copy machine reads an image as a signal for each pixel by a scanner 601, converts each signal into an 8-bit digital signal by an A/D converter 602, and applies image processing such as a gamma conversion by an image processing section 603. Then, the digital copy machine switches a signal change section 606 to B so as to send the image data to an image output section 607, and the image output section 607 outputs an image in accordance with the received image data.

A description will now be given of a case in which the image data is compressed and stored, and the encoded image data is decoded and output.

The scanner 601, the A/D converter 602 and the image processing section 603 perform the same process as the process of the normal output. A concentration value of the data from the image processing section 603 is encoded by the above-mentioned block encoding method. The code data corresponding to one page of the image is stored in a primary code storing section 605. After the code data for one page is stored, the code data is transferred from the primary code storing section 605 to a secondary code storing section 604 constituted by a hard disk or the like. Similarly, the code data of an original of a plurality of sheets is transferred to the secondary code storing section 604.

After the code data corresponding to the original of a desired number of sheets has been transferred to the secondary code storing section 604, the code data is read from the secondary code storing section 604 so as to carry out an output of the image data. First, the code data of the image stored in a head part of the secondary code storing section 604 is transferred to and stored in the primary code storing section 605, and the code data is decoded. Then, the signal change section 606 is switched to A, and the decoded data is sent to the image output section 607. The image output section 607 outputs an image in accordance with the decoded data.

The code data of the secondary code storing section 604 is sequentially read so as to repeat the above-mentioned operation. After decoding and outputting the code data of the image stored at the end, a one-set copy is output. A plurality of sets of copy can be output in the same manner.

A description will now be given, with reference to FIG. 3, of the primary code storing section 604 in detail. The primary code storing section 605 stores the image data, which is supplied on an individual line basis, in a four-line FIFO 701. Then, the above-mentioned block encoding is performed for each 4×4-pixel block by a primary encoding section 702, and the generated code data is stored in a code memory 703.

A description will now be given, with reference to FIG. 4, of the secondary code storing section 604. The secondary code storing section 604 comprises a secondary encoding section 802 and a storage device such as a hard disk 803. The code data corresponding to one sheet of the original stored in a code memory 801 is further encoded by the secondary coding section 802, and the further encoded data is stored in the hard disk 803. The secondary encoding section 802 generally uses a reversible encoding which does not have a difference between the data before encoding and the data at the time of decoding so that the code of block encoding can be decoded certainly.

Usually, as shown in FIG. 5, the average value La is encoded by using variable length coding such as WYLE coding of a differential value ΔL. The gradation width index Ld is encoded by using variable length coding such as a WYLE coding. φij is divided into high-order bits and lower-order bits, and encoded by a binary data encoding method such as MMR (Modified Modified Relative element address designate) method.

A description will be given below of a conventional printer image compression technology. As a method of compressing a binary image by small hardware, run-length image encoding of one-dimensional compression and MH coding such as a facsimile are known widely. As a method of compressing a binary image with a high compression rate, JBIG (Joint Bi-level Image experts Group) which is the international standard of a two-dimensional compression method is known. JBIG uses a QM-coder which is an arithmetic encoder as entropy coding. However, this method has a problem in that a context memory needed for the QM-coder as an arithmetic encoder and a line memory for producing a context require large-scale hardware and it is difficult to achieve a high-speed operation.

Japanese Laid-Open Patent Application No. 9-65147 discloses a modified MH coding method. When performing MH coding, a compression rate and a processing speed are improved by storing run lengths of black and white so as to produce a predetermined repetition code when a run length of either color matches an immediately preceding run length. Apparently, this method improves a compression rate and a processing speed by producing the repetitive code when coincidence of run lengths occurs. Accordingly, this method can improve the compression rate only when an amount of encoded data is smaller than an amount of a code word assigned to the data when the coincidence does not occur. However, since assignment of a shorter repetition code may increase a run length which does not incident relatively, it is difficult to obtain the code set having a sufficient compression rate with respect image data of which color frequently changes at a short interval.

Moreover, the code set disclosed in Japanese Laid-Open Patent Application No. 9-65147 is similar to the MH coding, and it is difficult to expect a high-speed operation since a large number of gates is required when a plurality of bits are processed in parallel.

Accordingly, the above-mentioned image encoding method can achieve a high compression rate for a specific image, but it is difficult to achieve a sufficient compression rate for image data having frequent color change at a short interval.

Japanese Laid-Open Patent Application No. 2000-217005 discloses a data encoding method solving the above-mentioned problem. The encoding method disclosed in this patent document converts a string of numerical values of run lengths into a predetermined code string on the basis of each color obtained by scanning data. A case where the numerical value of the run length is consistent with the numerical value of the immediately preceding run length of the same color is set as a consistency event, and a case where the consistence does not occur is set as an inconsistency event. A number of consecutive consistency events is set as a repetition number, and when the consistency event or consecution of the consistency events occurs, a repetition code corresponding to the number of consecutive events is generated. On the other hand, when the inconsistency event occurs, a code representing the numerical value of the above-mentioned run length is generated.

As mentioned above, conventionally, a copy image is compressed by a fixed length compression method (a method such as GBTC). In recent years, there is a demand for a compression rate greater than conventional due to a demand for storing image data in a memory or a hard disk. Thus, in order to satisfy such a demand, the code after the fixed length compression (GBTC) is further compressed by other compression apparatuses as mentioned above. However, there is an image data compression apparatus suitable for a characteristic of a printer image (which contains many repetitions of a binary image). Such a printer image and the above-mentioned copy image are individually compressed by separate encoders. Thus, there is a problem in that the scale of the hardware, a number of gates and the scale of software for achieving such data compression and encoding process are large.

SUMMARY OF THE INVENTION

It is a general object of the present invention to provide an improved and useful image data compression apparatus in which the above-mentioned problems are eliminated.

A more specific object of the present invention is to provide an image data compression apparatus which compresses code data obtained by compressing image data by a fixed length encoding method so as to reduce a scale of hardware and reduce a development cost of software for an image data compression.

In order to achieve the above-mentioned objects, there is provided according to one aspect of the present invention an image data compression apparatus, comprising: a binary image data processing part which processes binary image data in accordance with a run length encoding method, the binary image data processing part including an encoding part which encodes run lengths of the binary image data by an encoding part; and a multiple value image data processing part which processes multiple value image data in accordance with a prediction encoding method, wherein the encoding part of the binary image data processing part is commonly used by the multiple image data processing part so that the encoding part compresses both the binary image data and the multiple value image data.

In the image data compression apparatus according to the present invention, the binary image data processing part may comprise a run length processing part including: means for preparing a predetermined number of run lengths corresponding to a number of bits included in a plurality of bit patterns processed in parallel, and obtains a run length to be carried over to a subsequent pattern; and means for summing the run length to be carried over and the run lengths of the subsequent bit pattern, and the multiple image data processing part may comprise a prediction encode processing part which receives a fixed length code of the multiple image data, and separates parameters having a high consecution correlation from a quantized code part of the fixed length code so as to apply prediction encoding only to the separated parameters to generate a plurality of prediction codes.

Additionally, the encoding part may comprise: a repeat processing part which detects a number of repeats in a plurality of runs or the prediction codes so as to generate a repeat number; and an encode processing part which encodes the plurality of runs or the prediction codes, the quantized code part of the fixed length code and the repeat number.

Additionally, there is provided according to another aspect of the present invention an image data compression apparatus for compressing multiple value image data, comprising: a prediction encode processing part which receives a fixed length code of the multiple image data, and separates parameters having a high consecution correlation from a quantized code part of the fixed length code so as to apply prediction encoding only to the separated parameters to generate a plurality of prediction codes; a repeat processing part which detects a number of repeats in the plurality of prediction codes so as to generate a repeat number; and an encode processing part which encodes the plurality prediction codes, the quantized code part of the fixed length code and the repeat number.

Additionally, there is provided according to another aspect of the present invention an image data compression method for compressing multiple value image data, the method comprising the steps of: receiving a fixed length code of the multiple image data; separating parameters having a high consecution correlation from a quantized code part of the fixed length code; applying prediction encoding only to the separated parameters so as to generate a plurality of prediction codes; detecting a number of repeats in a plurality of prediction codes so as to generate a repeat number; and encoding the prediction code, the quantized code part of the fixed length code and the repeat number.

According to the present invention, both the binary image data (printer data) and the multiple value image data (copy data) can be processed by the same image data compression apparatus with addition of only the prediction encode processing part. Thus, the image forming apparatus of the present invention can achieve reduction in a hardware development cost, a number of gates of the hardware and a software development cost. Moreover, the multiple value image data after being compressed by a fixed length compression method (such as GBTC) can be compressed further.

Other objects, features and advantages of the present invention will become more apparent from the following detailed description when read in conjunction with the accompanying drawings.

BRIEF DESCRIPTION OF THE DRAWINGS

FIG. 3 is a block diagram of a primary code storing section shown in FIG. 2;

FIG. 4 is a block diagram of a secondary code storing section shown in FIG. 2;

FIG. 5 is an illustration for explaining a conventional encoding method;

FIG. 15 is an illustration showing a code format;

FIG. 37 is an illustration for explaining ⅜ GBTC encoding;

DETAILED DESCRIPTION OF THE PREFERRED EMBODIMENT

A description will now be given, with reference to the drawings, of an image data compression apparatus according to a first embodiment of the present invention.

Figure 6:
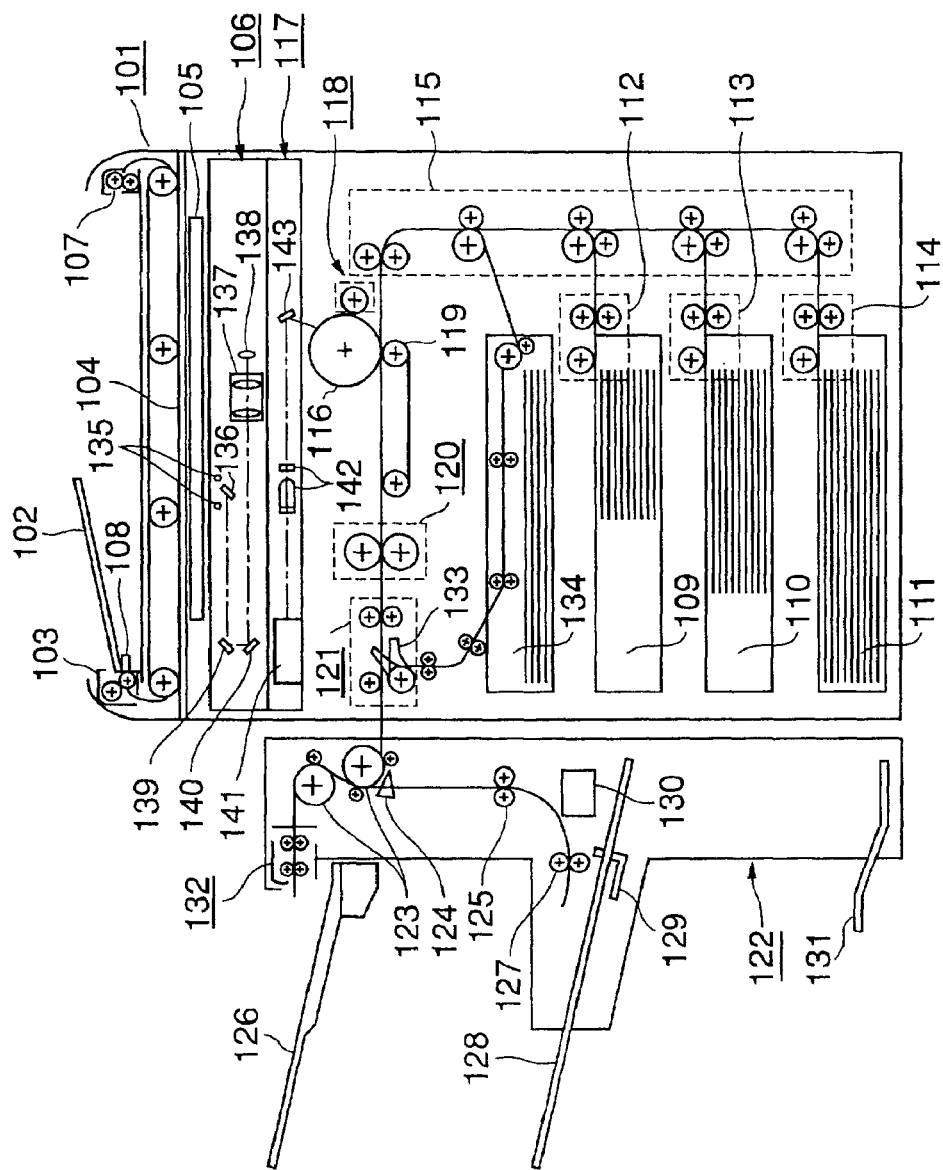
FIG. 6 is an illustration of an image forming apparatus (digital copy machine) equipped with an image data compression apparatus according to an embodiment of the present invention.

FIG. 6 is an illustration of an image forming apparatus (digital copy machine) equipped with an image data compression apparatus according to an embodiment of the present invention. In FIG. 6, a bundle of original documents is placed on a manuscript table 102 of an automatic document feeder (hereinafter, referred to as ADF) with an image surface of each of the original documents facing upward. When a start key of an operational section is pressed, the original documents are sequentially fed to a predetermined position of a contact glass 105 by a feed roller 103 and a feed belt 104 one after another from the lowermost sheet of the original documents.

After reading an image of each of the original document on the contact glass 105 by a reading unit (scanner) 106, the original documents are ejected by a feed belt 104 and an eject roller 107. Furthermore, when it is detected that the following original document is present on the manuscript table 102 by an original document set detector 108, the original document is fed to the predetermined position on the contact glass 105 in the same manner. The feed roller 103, the feed belt 104, and the eject roller 107 are driven by a motor.

Record papers loaded into a first tray 109 or a second tray 110 and a third tray 111 are fed by a first feeding apparatus 112 or a second feeding apparatus 113 and a third feeding apparatus 114, respectively, and are conveyed by a vertical feed conveyance 115 to a position where they are brought into contact with a photo-conductor drum 116. Based on the image data obtained by the reading unit 106, a latent image is written on the photo-conductor drum 116 by a laser projected by a writing unit 117. The latent image is converted into a toner image by being passed though a development unit 118. The record papers are conveyed by a conveyance belt 119 at a speed equal to the rotation speed of the photo-conductor drum 106. The toner image on the photo-conductor drum 116 is transferred onto the record paper. Then, the toner image is fixed by a fixing unit 120, and the record papers area supplied to a finisher 100 of a post-processing apparatus by an eject unit 121.

The finisher 122 can direct the record papers conveyed by the eject roller of a body toward a regular eject roller 132 or a staple processing part. By changing a switching plate 124 upward, the record paper can be ejected to a regular eject tray 126 via a conveyance roller 123. On the other hand, by changing the switching plate 124 downward, the record paper can be ejected to a staple table 128 via conveyance rollers 125 and 127.

One side of the record papers stacked on the staple table 128 are aligned by a jugger 129 on an individual record paper basis when the record papers are ejected one after another, and the record papers area stapled by a stapler 130 after completion of one set of copy. A set of the record papers stapled by the stapler 130 is accommodated in a staple completion eject tray 131. The eject tray 128 is movable in forward and rearward directions. The eject tray part 128 sorts the record papers by moving forward and rearward based on an individual original document basis or an individual set of copy sorted by an image memory.

When forming an image on both sides of the record paper, the record paper fed from the first tray 109, the second tray 110 or the third tray 111 and an image is formed on one side thereof is not led to the eject tray side. That is, the record paper on which the image is formed is temporarily stored in a both-side feed unit 134 by setting a branch claw 133 for path switch to an upper side. In order to transfer a toner image formed on the photo-conductor drum 116 on the other side of the record paper, the record paper is fed from the both-side feed unit 134, and is led to the eject tray by setting the branch claw 133 to a lower side. Thus, The both-side fed unit 134 is used when forming images on both sides of the record paper.

The photo conductor drum 116, the conveyance belt 119, the fixing unit 120, the eject unit 121 and the development unit 118 are driven by a main motor. The first feeding apparatus 112, the second feeding apparatus 113 and the third feeding apparatus 114 are driven by transmitting a drive force of the main motor through respective feed clutches. The vertical conveyance unit 115 is driven by transmitting the drive force of the main motor through a middle clutch.

The reading unit (scanner) 106 comprises the contact glass 105 on which the original document is placed and an optical scanning system. Then optical scanning system comprises an exposure lamp 135, a first mirror 136, a lens 137, a CCD image sensor 138, etc. The exposure lamp 135 and the first mirror 136 are fixed on a first carriage (not shown in the figure). The second mirror 139 and the third mirror 140 are fixed on a second carriage (not shown in the figure). When reading an image of the original document, the first carriage and the second carriage are mechanically scanned with a relative velocities of 2 to 1 so that the optical path length may not change. The optical scanning system is driven by a scanner drive motor (not shown in the figure).

The image of the original document is read by the CCD image sensor 138 so as to be converted into an electrical signal (analog image signal), and then is converted into digital data (image data). Thereafter, several kinds of picture processing are applied to the image data. The magnification of the image can be changed by moving the lens 137 and the CCD image sensor 138 in horizontal directions in FIG. 6. That is, the lens 137 and the CCD image sensor 138 is moved to predetermined positions in response to a designated magnification.

The writing unit 117 comprises a laser output unit 141, an image-formation lens 142, a mirror 143, etc. In the laser output unit 141 is equipped with a laser diode as a laser light source and a polygon mirror, which is rotated at a constant high speed by a motor. The laser light irradiated from the laser output unit 141 is scanned by the polygon mirror, which is rotated at a fixed speed. The scanned laser light passes through the image-formation lens 142, reflected by the mirror 143, and focused on a surface of the photo-conductor drum 116.

The laser light is scanned in a direction (main scanning direction) perpendicular to a direction of rotation of the photo-conductor drum 116, and recording of an image signal output from an image processing section (not shown in the figure) is carried out on an individual line basis. By repeating a main scan with a predetermined period corresponding to the rotating speed and recording density of the photo-conductor drum 116, an image (electrostatic latent image) is formed on the surface of the photo conductor 116. As mentioned above, the laser light output from the writing unit 117 is irradiated onto the photo conductor drum 116 of the image forming system.

A beam sensor (not shown in the figure), which generates a main scan synchronization signal, is located at a position close to an end of the photo-conductive drum 116 and where the laser light is irradiated. A control signal for performing control of the image record start timing of the primary scanning direction and input and output of the image signal is generated based on the main scan synchronization signal.

Figure 7:
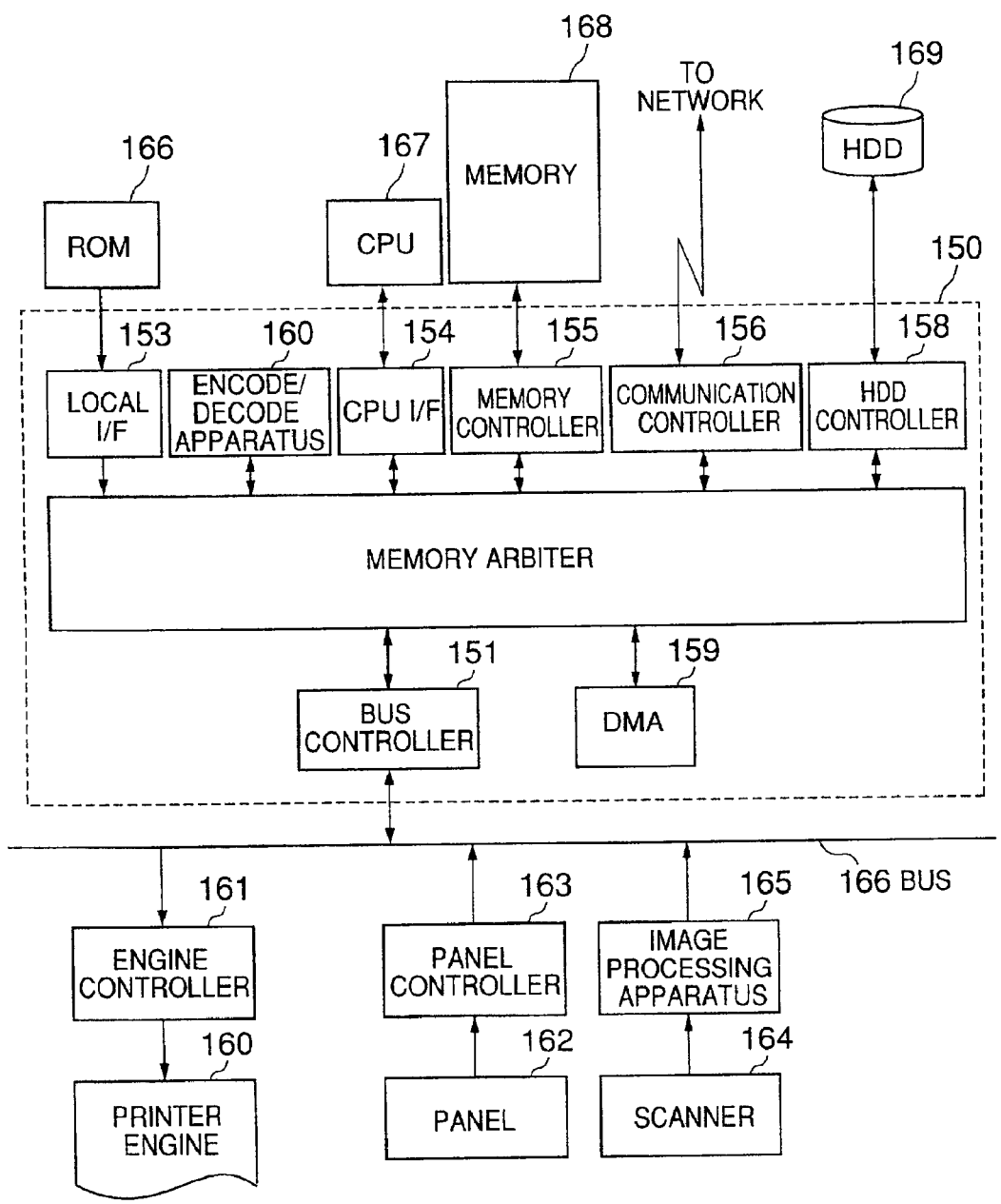
FIG. 7 is a block diagram showing a structure of an electric parts control device of the image forming apparatus shown in FIG. 6.

FIG. 7 is a block diagram showing a structure of an electric parts control device of the image forming apparatus shown in FIG. 6. An image memory accelerator 150, which mainly operates image memory, is controlled by a CPU 167. The image memory accelerator 150 receives image data from a host computer through a network, performs encoding etc., and transmits the image data to a memory 10. Moreover, the image memory accelerator 150 transmits the image data to an engine controller 161 so as to perform a print-out operation. At this time, various operations are performed such as communication with each host computer, a control of a memory 168 or a bus control with peripheral devices such as a printer controller.

A bus controller 151 performs bus arbitration for each peripheral device connected to the bus 166. A memory arbiter 152 performs arbitration between the memory 168 and various kinds of controllers. A local I/F 153 is an interface of a ROM 166, and is connected to the memory 10 and the CPU 167 via the memory arbiter 152. The ROM 166 stores various kinds of programs and font information such as a character.

An encoding/decoding apparatus 160 is connected to the memory 168 and the CPU 167 via the memory arbiter 152 so as to encode/decode the image data from the memory 168. The CPU I/F 154 is an interface of the CPU 167, and is connected to the memory 168 and various controllers via the memory arbiter 152. The CPU 167 controls the whole printer apparatus.

The memory controller 155 controls the memory 168, and is connected to various controllers and the CPU 167 via the memory arbiter 152. The memory 168 stores image data, code data, CPU program, etc. The communication controller 156 is connected to a network so as to receive various sets of data, commands, etc. through the network. The communication controller 156 is connected to various kinds of controllers via the memory arbiter 152. The printer controller 161 is connected to the bus 166 so as to control the printer engine 160. A panel controller 163 controls a panel 162. The panel 162 sends a notification of an operation of a user to a printer apparatus. The bus 166 connects the image memory accelerator 150 to various peripheral controllers. A DMA 159 performs a direct memory access between the controllers connected to 152.

A hard disk drive (HDD) controller 158 controls a hard disk drive (HDD) 169. The HDD 169 stores the coded image code. The scanner 164 reads an image by charge coupled device (CCD). The image processing apparatus 165 performs image processing such as a shading compensation or an MTF gamma correction to the image data supplied by the scanner 164.

Figure 8:
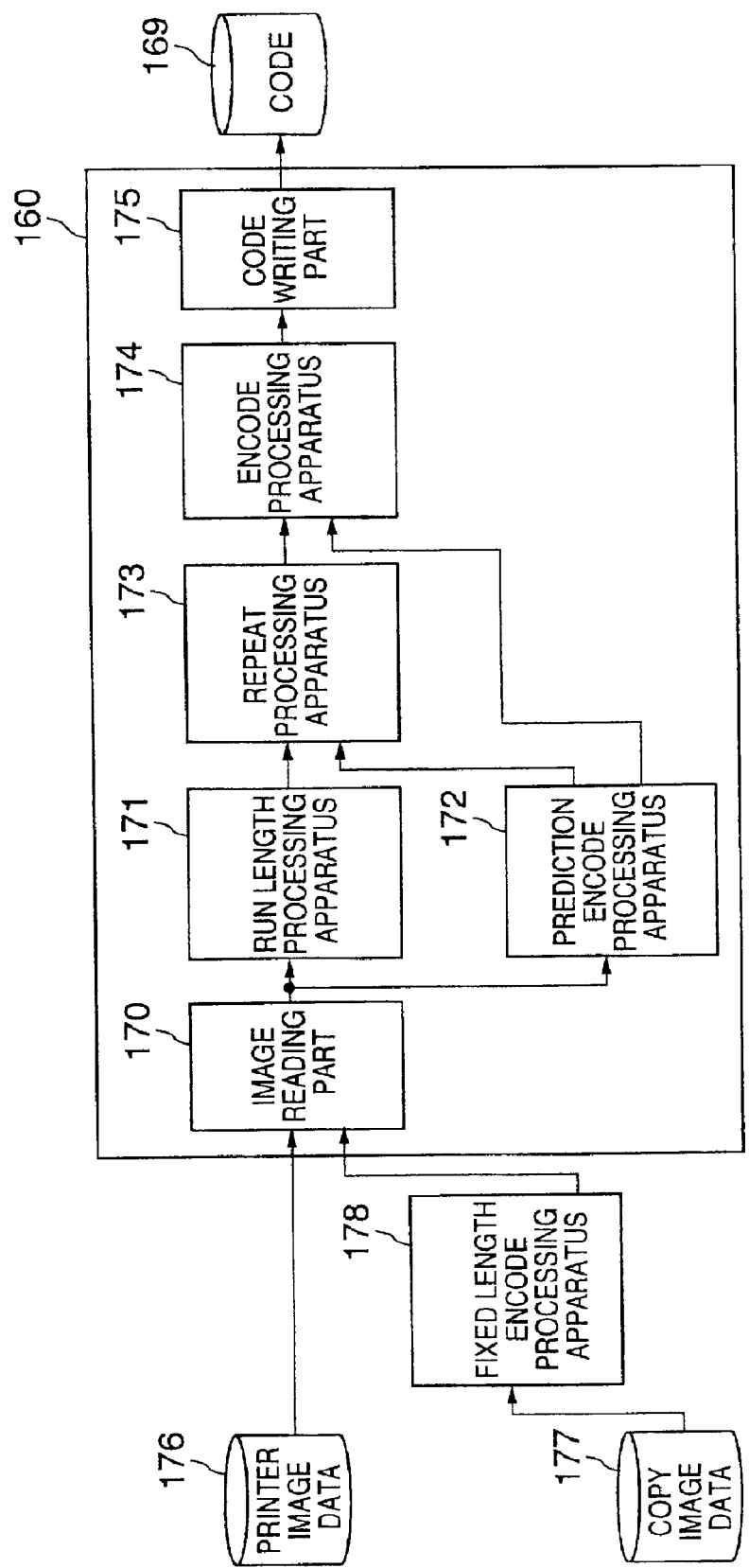
FIG. 8 is a block diagram of an encoding/decoding apparatus shown in FIG. 7.
Figure 36:
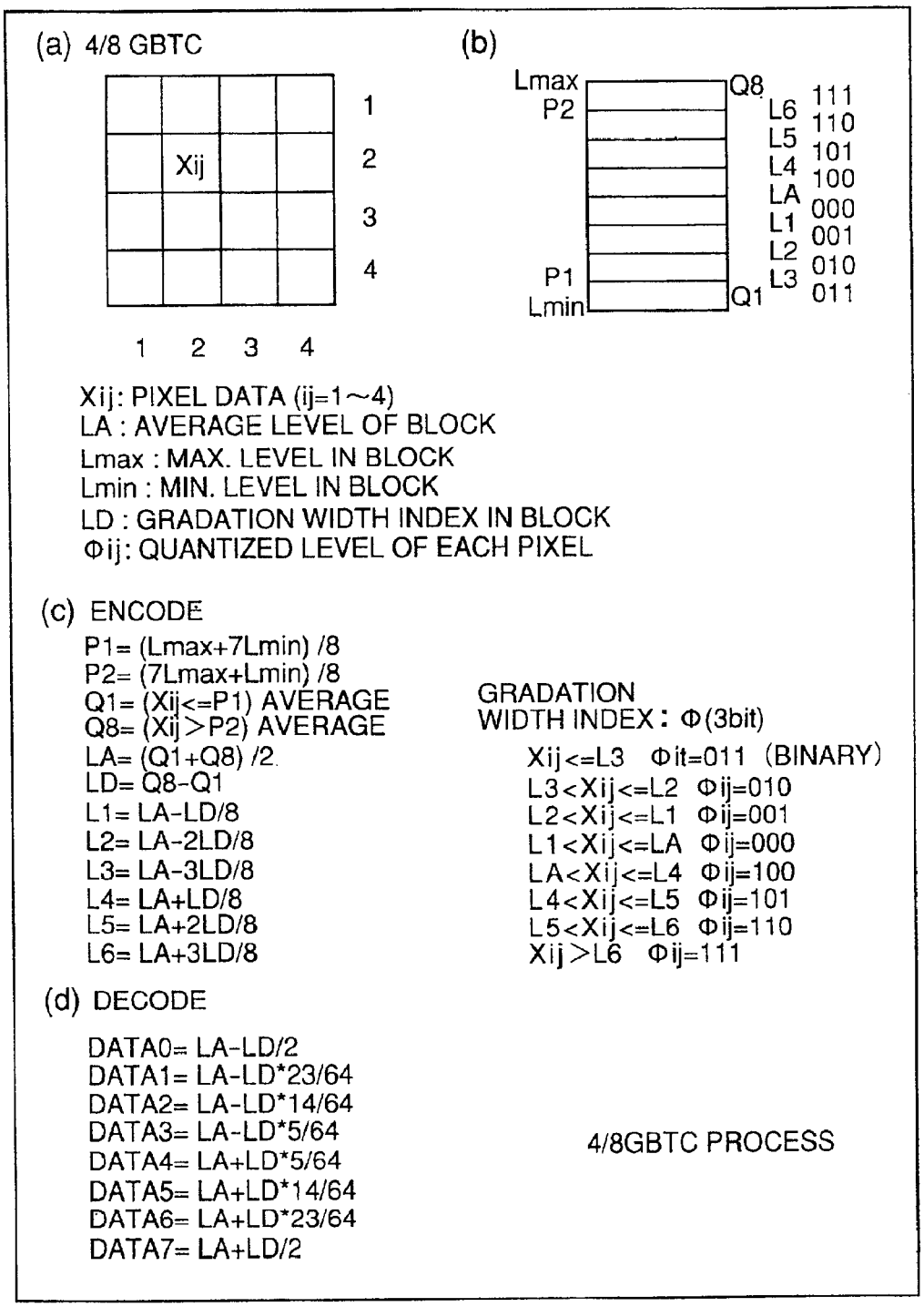
FIG. 36 is an illustration for explaining ⅛ GBTC encoding.
Figure 38:
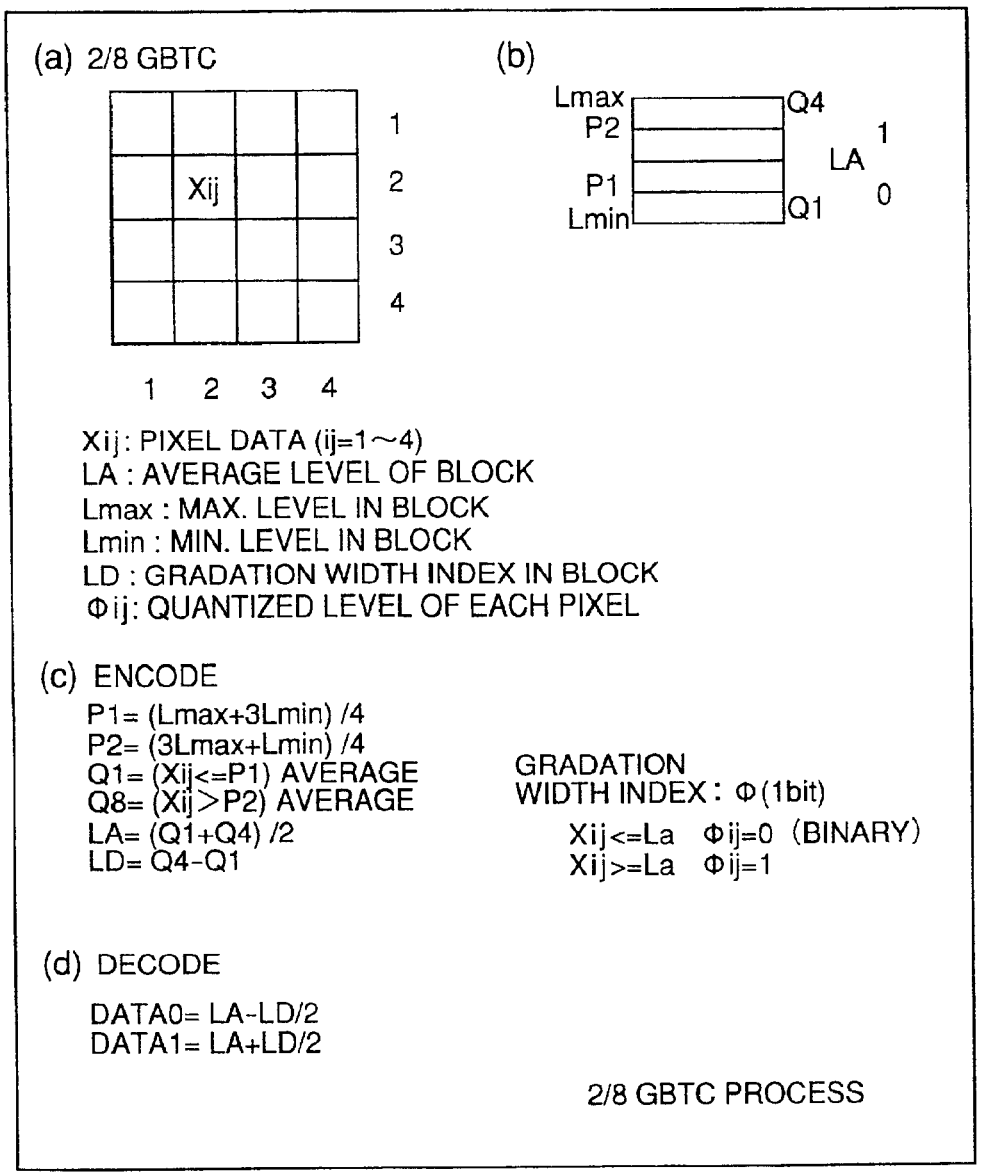
FIG. 38 is an illustration for explaining ⅖ GBTC encoding.
Figure 39:
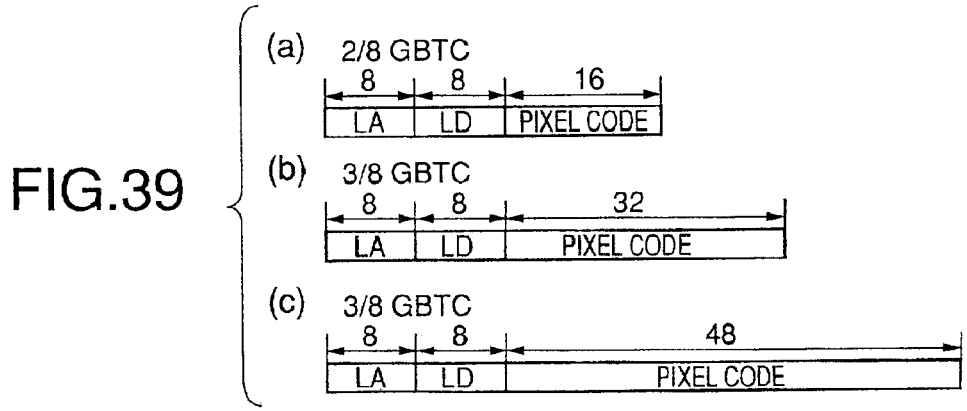
FIG. 39 is an illustration for explaining a GBTC format.

FIG. 8 is a block diagram of the encoding/decoding apparatus 160 shown in FIG. 7. In FIG. 8, a Memory 176 stores image data for a printer. A memory 177 stores image data for a copy. A fixed length encoding apparatus 178 compresses the data of a copy image according to a fixed length by a data compression method such as GBTC. It should be noted that FIGS. 36 through 38 show the computing equations of each GBTC (⅛, ⅜, and ⅔ encoding). Moreover, FIG. 39 shows a format of the fixed length code of each GBTC method.

In FIG. 8, an image reading part 170 reads image data from the memory 176 and the fixed length encoding apparatus 178. The memory 176 is chosen at the time of the copy mode. A run length processing apparatus 171 converts binary data read by the image reading part 170 into a run length (a length of zero value and a length of one value), and transfers them to a processing apparatus repeatedly.

Figures 1, 2:
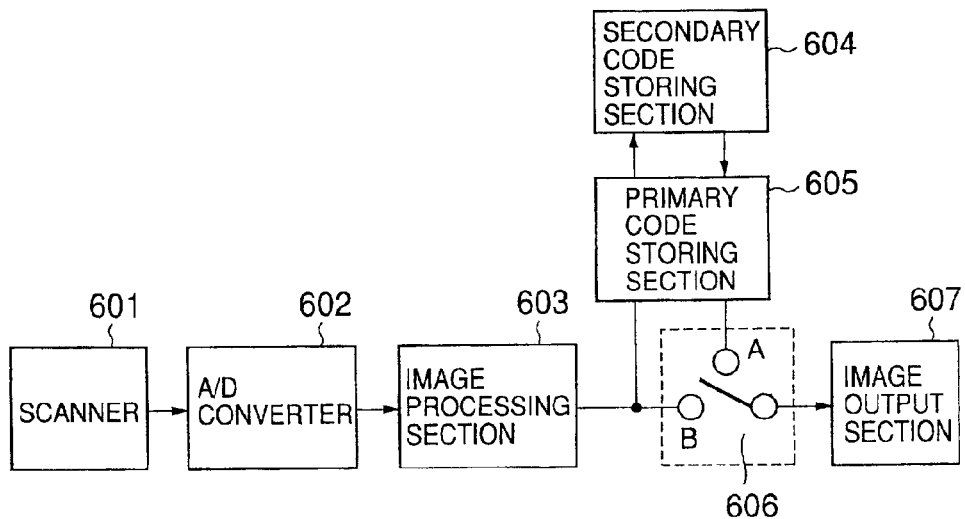
FIG. 1 is an illustration for explaining an algorithm of a conventional block encoding method.
FIG. 2 is a block diagram of a digital copy machine having a function to compress and store image data in a memory and to store the encoded image data further in a hard disk.

A prediction encoding apparatus 172 receives a fixed length code as shown in FIG. 1 from the fixed length encoding apparatus so as to perform prediction encoding of a pair part correlated with preceding and proceeding fixed codes.

In the example of GBTC of FIG. 1, encoding of an average level of the block LA and the part of the gradation width index is performed. In order to facilitate an execution of the process to obtain the number of repetition by the repeat processing apparatus 174. The fixed length codes preceding and proceeding a plurality of codes and prediction encoding off a pair part of the correlation are repeatedly transferred to a processing apparatus 173. Then, the quantization code is separated, and a code part is not subjected to the prediction encoding, and is transferred to the processing apparatus 174.

At the time of a printer operation, the repeat processing apparatus 173 calculates the repeat of the run length from the run length processing apparatus 171, and transfers the number of repeats and the run length to the encode processing apparatus 174. Moreover, the repeat processing apparatus 173 receives a prediction code from the prediction coding processing apparatus 172 at the time of a copy operation, calculates a number of repeats, and transfers the number of repeats and the prediction code to the encode processing apparatus 174.

The encode processing equipment 174 encodes the run length and the number of repeats from the repeat processing equipment 173 and the quantization code from the prediction coding processing apparatus 172. The code writing part 175 carries out writing of the code generated by the code processing apparatus 174 on the memory 179.

Figure 9:
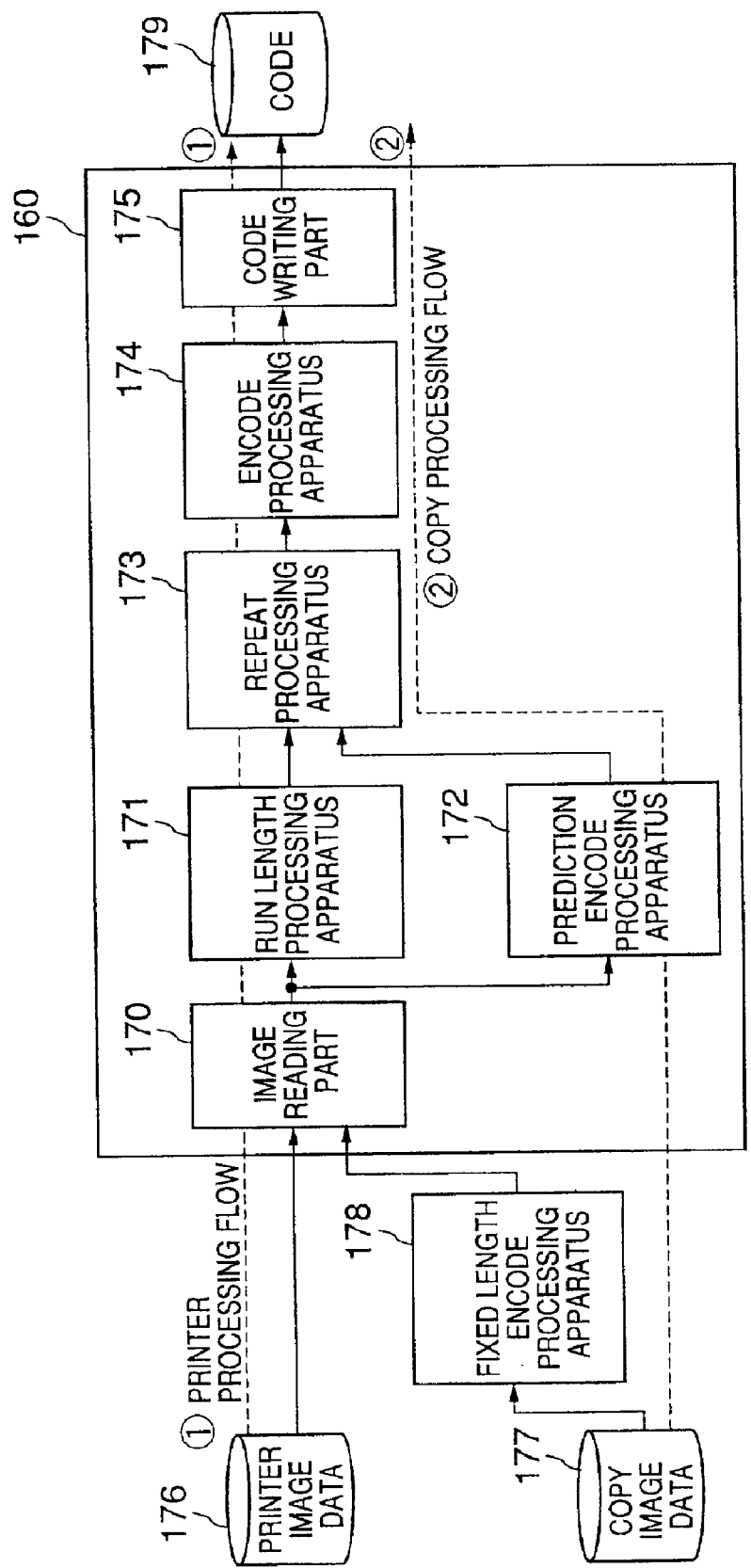
FIG. 9 shows a process flow of the image processing at the time of printer processing and copy processing.

FIG. 9 shows a process flow of the image processing at the time of printer processing and copy processing. A description will be given below of each block mentioned above in detail. It should be noted that in the present invention it is assumed that the image data is concurrently processed for each 4 bits.

Figure 10:
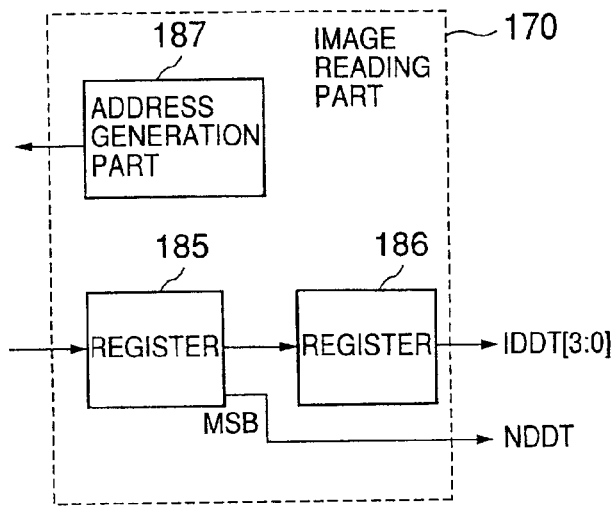
FIG. 10 is a block diagram showing a structure of an image reading part 170 shown in FIG. 8.

FIG. 10 is a block diagram showing a structure of the image reading part 170 shown in FIG. 8. Registers 185 and 186 are pipeline-connected, and store the image data read from the memory. The register 186 stores the currently-processed data, and the register 185 stores the subsequent data. The register 185 sends MSB data (a first bit of the subsequent data) to the run length processing apparatus 171. The address generator 187 generates the memory address.

Figure 11:
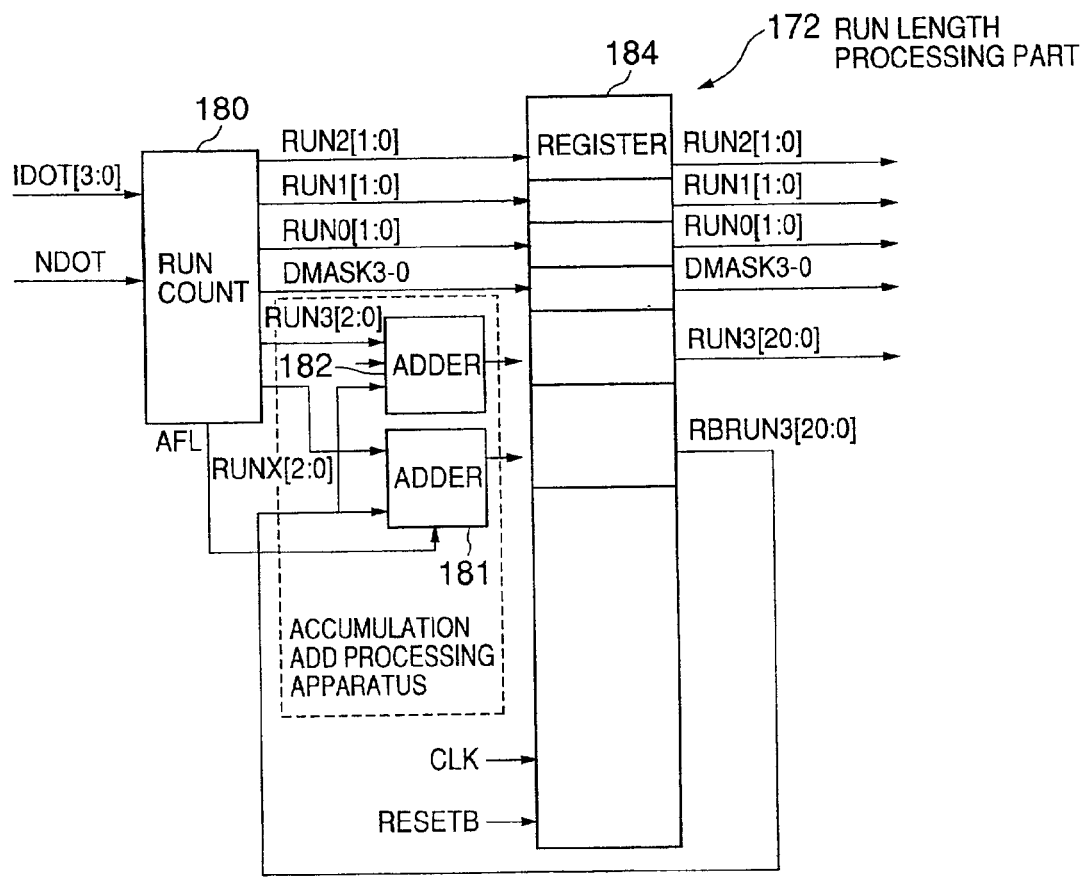
FIG. 11 is a block diagram showing a structure of a run length processing apparatus shown in FIG. 8.

FIG. 11 is a block diagram showing a structure of the run length processing apparatus 171 shown in FIG. 8. The run length processing apparatus 171 obtains a plurality of closed run lengths (maximum of 4 pieces for 4 bits), a mask value which indicates whether or not the run lengths are valid and a run length to be carried over, from an image pattern (IDOT) of 4 bits and a first bit (NDOT) of a subsequent pattern from the image reading apparatus 170 according to a run count method. Then, the run length processing apparatus generates a plurality of closed run lengths and the mask value by determined by an accumulation addition processing apparatus whether to add the run length carried over thus far to the first run length RUN 3 in the pattern (IDOT) or carry over again. The closed run length means the run length of which beginning and ending of run length of 0 or 1 can be clearly determined.

For example, if all of the 4 bits are 0 and NDOT is also 0, the number of the closed run length is zero. If all of the 4 bits are 0 and NDOT is 1, there is one closed run length. If the 4 bits are "1010" and NDOT is 1 and the preceding pattern is disregarded, there are four closed run lengths. If the 4 bits are "1010" and NDOT is 0 and the preceding pattern is disregarded, there are three closed run lengths.

Each part is explained below.

The run count 180 receives image data of 4 bits and a first bit of the subsequent data from the image reading part 170, and outputs four run lengths at maximum. RUN3-RUN0 are run lengths. DMASK3-DMASK0 are flags which show whether the run length of RUN3-RUN0 are valid. RUNX is a run length which is carried over. AFL is a flag which takes a value of 1 when all of the four bits are 0 or 1 and NDOT (a first bit of the subsequent data) is the same value.

When AFL is 1, an adder 181 adds a carry over run length of the run count 180 to the sum (RBRUN3) of the run lengths previously carried over and stored in a register 184, and produce a new sum (RBRUN3) of the carry-over run lengths. When AFL is 0, the run length carried over to a next is set to the sum (RBRUN3) of the previous carry-over run length. An adder 182 adds the first run length RUN3 to the sum (RBRUN3) of the previously carried over run length RUN3 so as to obtain a run length consideration of the previous carry-over run lengths. The accumulation addition processing apparatus 183 is constituted by the adders 181 and 182.

Figure 12:
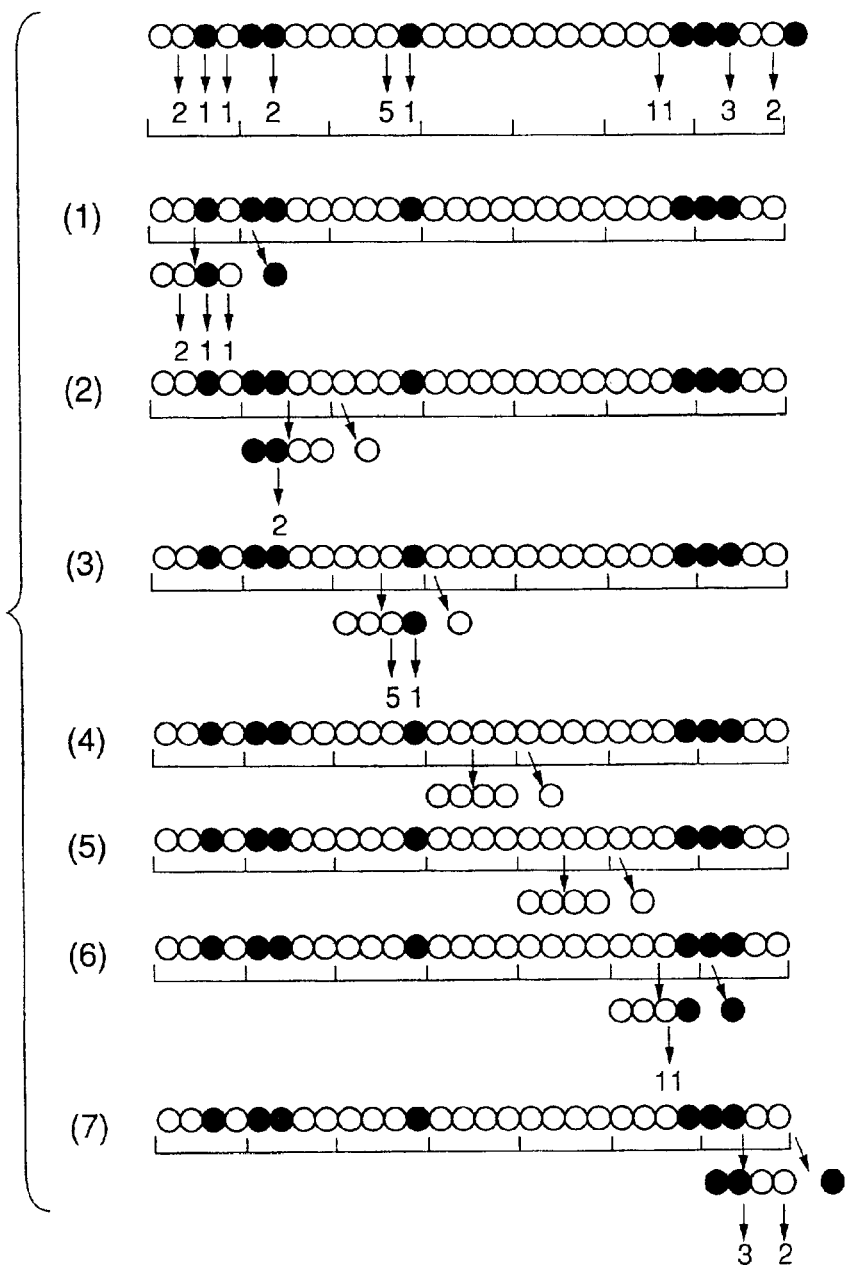
FIG. 12 shows an example of processing of a register.

FIG. 12 shows an example of processing of the register 184.

(1) is a first process in which the first 4 bits area concurrently processed so as to obtain a plurality of run lengths. In this process, the first bit of the 4 bits of the image to be processed next is "1", and the last bit of the 4 bits of the image being processed is "0." Thus, the concurrently processed 4 bits have three closed run lengths inside. The run lengths are "2", "1" and "1".

(2) is a second process in which a first bit of the 4 bits is "0" and the last bit of the 4 bits is "0". Thus, the concurrently processed 4 bits do not have a closed run length inside, and the last run length is transferred to the next process. Therefore, there in only one run length "2".

(3) is a second process in which there are three run lengths and a first bit of the next 4 bits is "0" and the last bit off the 4 bits being processed is 2". Accordingly, since the concurrently processed 4 bits are closed inside and the run length carried over from the previous process is "2", the carry-over run length "2" is added to the first run length "3" obtained in this process and the first run length becomes 5. Here, two run lengths, "5" and "1" are obtained.

(4) is an example in which the 4 bits are not closed and there is no run length.

(5) is an example the same as the example of

In (6), the run lengths carried over from (4) and (5) are added, and a run length of "11" is obtained.

Figure 13:
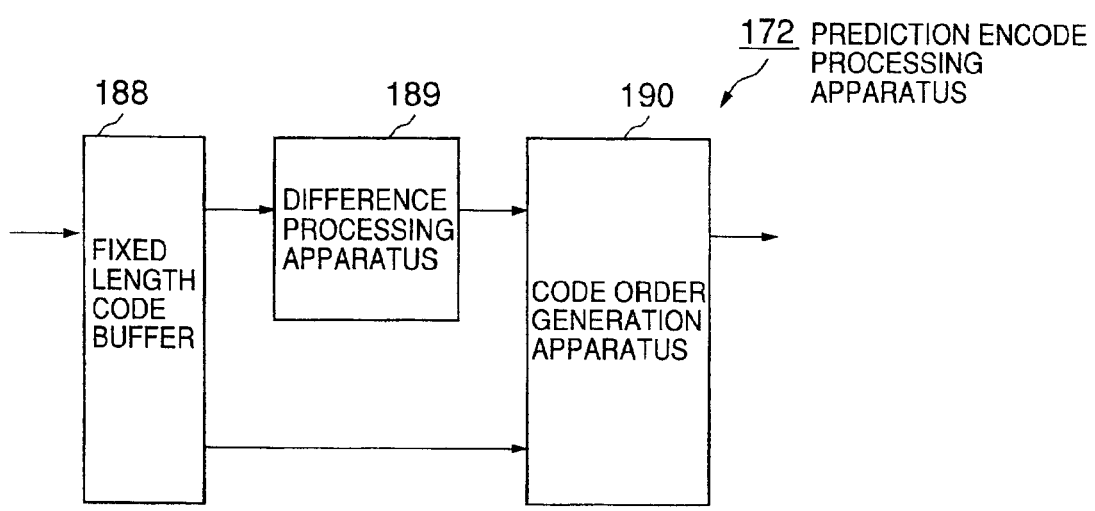
FIG. 13 is a block diagram showing a structure of a prediction encoding processing apparatus shown in FIG. 8.

FIG. 13 is a block diagram showing a structure of the prediction encoding processing apparatus shown in FIG. 8. A fixed length code buffer 188 stores a plurality of fixed length codes based on GBTC as shown in FIG. 39. A difference processing apparatus 189 performs prediction encoding of a part having a correlation with the preceding and proceeding fixed length codes. In the example of GBTC of FIG. 39, the prediction encoding is performed on the average level of the blocks LA blocks and a part of the gradation width index within the block LD.

In order to facilitate a process for obtaining the number of repeats by the repeat processing apparatus 173, the code order generation apparatus 190 separates the prediction encoding of a part having a correlation with the preceding and proceeding fixed length codes of a plurality of codes from the quantization codes shown in FIG. 39, and transfers them to the repeat processing apparatus 173. The repeat processing apparatus 173 does not carry out prediction encoding, but transfers the quantization code part to the encode processing apparatus 174.

Figure 14:
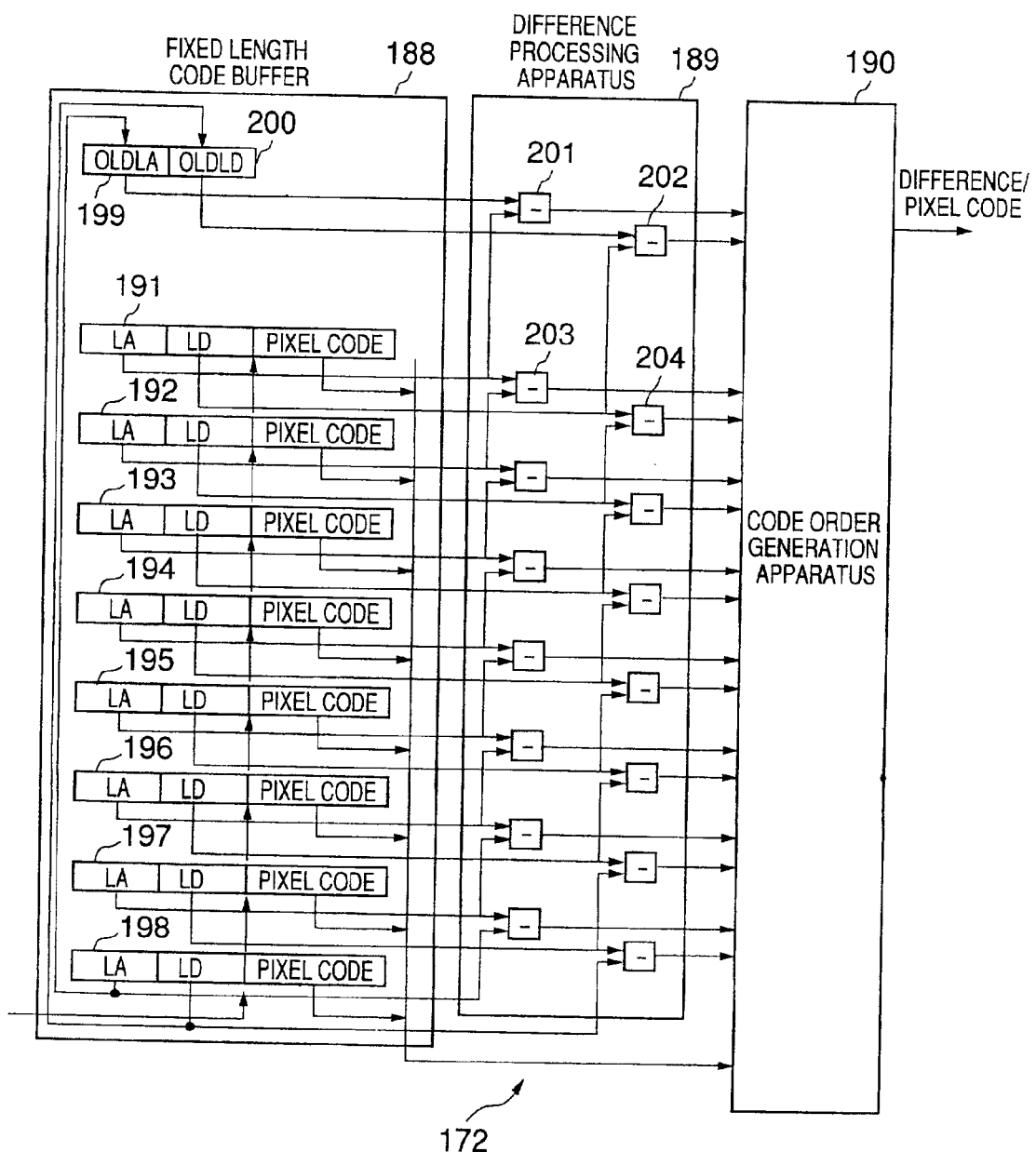
FIG. 14 is a block diagram showing a detailed structure of the prediction encoding processing apparatus shown in FIG. 8.

FIG. 14 is a block diagram showing a detailed structure of the prediction encoding processing apparatus shown in FIG. 8. This example uses GBTC as a fixed length encoding method. Here, a description will be given of the fixed length code buffer 188. Registers 191–198 store fixed length codes. Registers 199 and 200 store the part having a correlation with preceding and proceeding fixed length coeds of the last fixed length code in the last process (if it is GBTC, it is the part of the gradation width index within the average level of a block LA and the block LD).

A description will now be given of the difference processing apparatus 189. A subtractor 201 performs prediction encoding of the average level of the block of the preceding LA and the block of the first LA. A subtractor 202 performs prediction encoding of the gradation width index within the block of the preceding LD and the gradation width index within the block of the first LD. Similarly, a subtractor 203 performs prediction encoding of the average level of the block of the first LA and the block of the second LA. A subtractor 204 performs prediction encoding of the gradation width index within the block of the first LD and the gradation width index within the block of the second LD. Similar processes are performed by the shown in FIG. 14.

Figure 16:
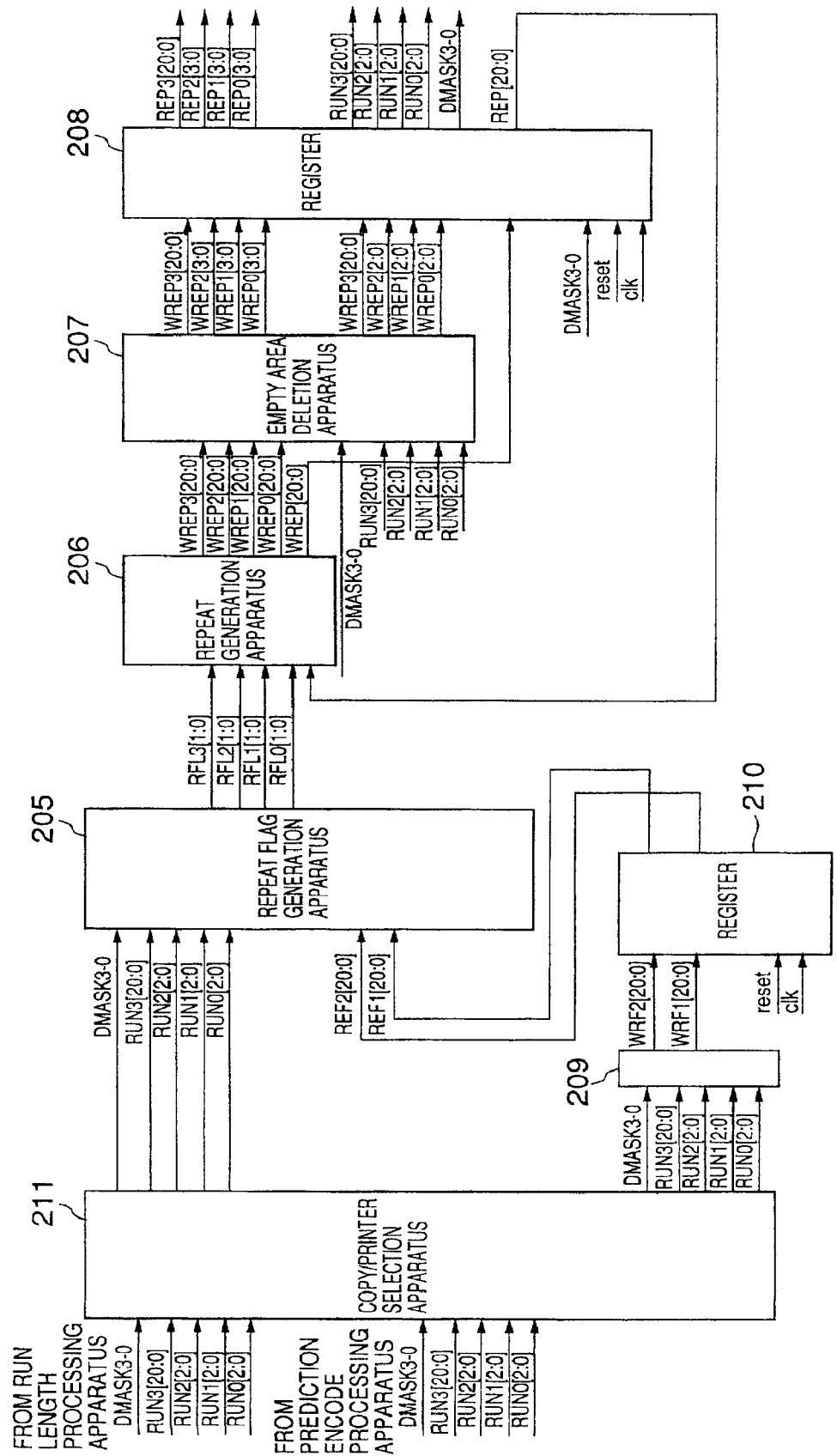
FIG. 16 is a block diagram of a repeat processing apparatus shown in FIG. 8.

FIG. 16 is a block diagram showing a structure of the repeat processing apparatus 173 shown in FIG. 8. The repeat processing apparatus 173 obtains a number of repeats of a plurality of run lengths in accordance with a plurality of run lengths obtained by the run length processing apparatus 171 and the first and second run length of the preceding pattern from the end thereof.

Then, the repeat flag generation apparatus 205 compares the plurality of run lengths obtained by the run length processing apparatus 171 with the second and the first run lengths of the preceding pattern from the end thereof so as to determine whether or not each of the plurality of run lengths obtained by the run length processing apparatus 171 is equal to the second preceding run length. Furthermore, a repeat number generation apparatus 206 obtains a plurality of repeat numbers (WREP3–0) and a number (WREP) of repeats to the next pattern based on a pattern of repeat flags (RFL3–0) and a number (REP) of repeats to the present pattern.

A description will now be given of each part in FIG. 16. A repeat flag generation apparatus 205 receives a plurality of run lengths, a mask value thereof, a second preceding run length and a first preceding run length of the preceding pattern from the run length processing apparatus 171. Then, the repeat flag generation apparatus 205 compares whether each run length from the run length processing apparatus 171 matches a second preceding run length, and output the results as repeat flags RF3–0.

A repeat number generation apparatus 206 receives the repeat flags RF3–0 and the number (REP) of repeats thus far so as to generate a plurality of numbers of repeats. The empty area deletion apparatus 207 shifts the part (the number of repeats is 0) in which no information is provided as it is determined as a repeat by the repeat number generating apparatus 206 in accordance with a plurality of number of repeats and a plurality of run lengths received from the repeat number generating apparatus 206 so as to packs the number of repeats and run length in a direction toward WREP3 and WRUN3.

The results of operation of the empty area deletion apparatus 207 are output via a register 208. A next run length generation apparatus 209 obtains the second and first run length from the rear end so as to generate the repeat flag for the next pattern. The results of operation of the next run length generation apparatus 209A are output via a register 210. A copy/printer selection apparatus 211 transfers information from the prediction encoding apparatus to the encode processing apparatus 174 when the copy mode is set. The copy/printer selection apparatus 211 transfers information from the run length processing apparatus 171 to the repeat flag generation apparatus 205 and the next run length generation apparatus 209 when the printer mode is set.

Figure 40:
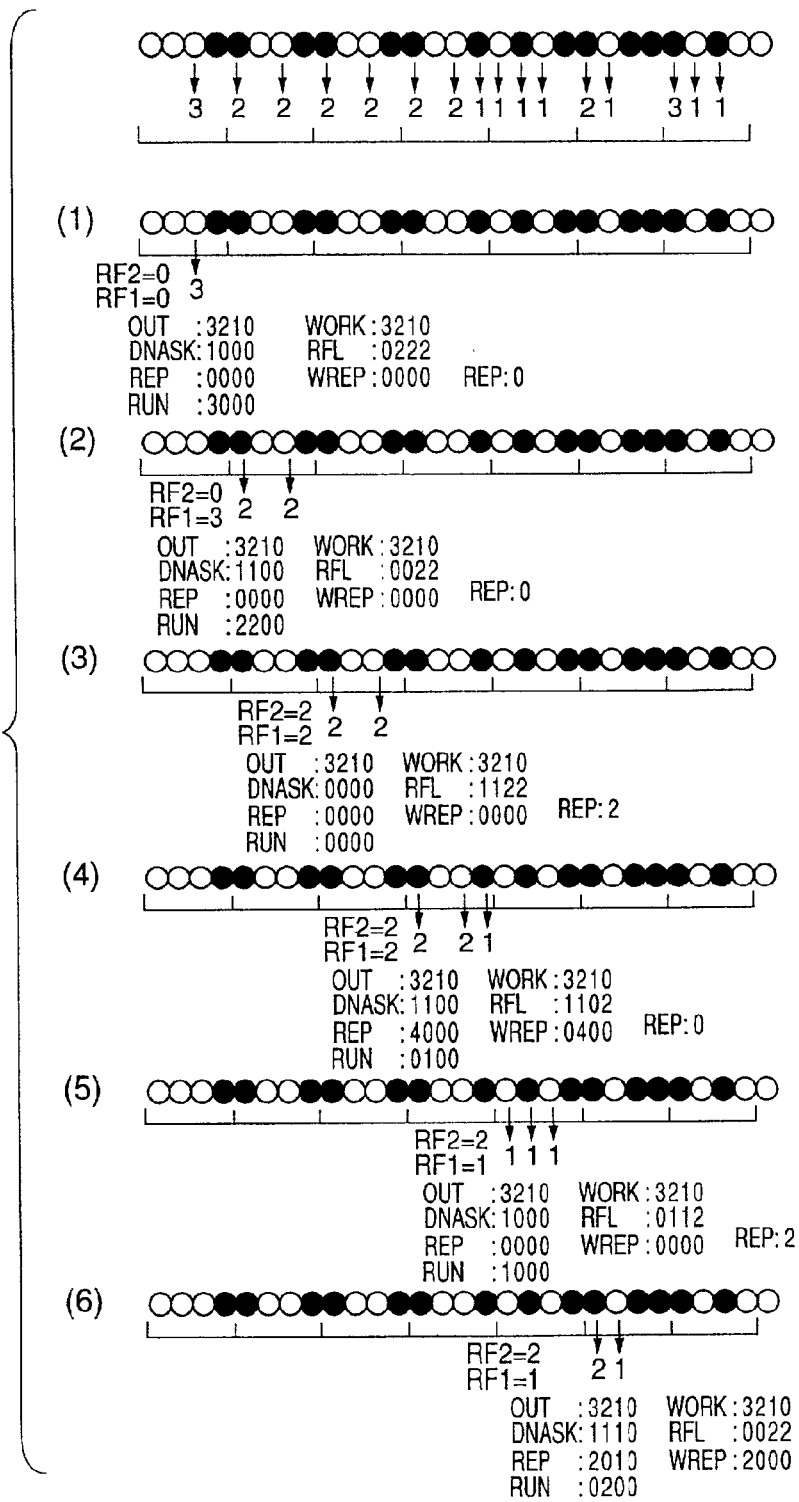
FIG. 40 shows an example of repeat processing.

FIG. 40 shows an example of repeat processing. (1) is an example in which the first 4 bits are processed in parallel so as to find a repeat. OUT expresses an output of the repeat processing apparatus 173. DMASK represents a valid flag of four runs, "1" indicates validity and there is a number of repeats in the item. REP expresses a number of repeats, and "0" indicates that the item is not a repeat but a run length.

RUN expresses a run length. WORK expresses main signals inside the repeat processing apparatus. RFL is an output of the repeat flag generation apparatus 205 showing a repeat flag, and 0 is indicated if the item is a run length, 1 is indicated if the item is a repeat and 2 is indicated if there is nothing,. WREP expresses the number of repeats and is output from the repeat number generation apparatus 206.

REP expresses the number of repeats under continuation. RF2 and RF1 are the last two run lengths of the preceding process, RF1 is the last run length and RF2 is the run length preceding the last run length. Here, since RF2 and RF1 are initial values, they have initial values (run length of zero is a numerical value which is not possible). Although one run length "3" is input here, there is no repeat.

(2) is the second process, and two run lengths, "2" and "2", are input. There is no repeat. (3) is the third process, and two run lengths "2" and "2" are input. Here, the first run length "2" matches the value of RF2, and is recognized as the number of repeats. The next "2" also matches the value of RF1, and is recognized as the number of repeats. The repeat flag RFL is "1" in items 2 and 3. However, the item of 1 is "2" and this indicates that the repeat is still continuing. Therefore, the continuing repeat number "2" is stored in REP. Thus, the number repeats is not output to WREP.

(4) is the fourth process, and three run lengths "2", "2" and "1" are input. Here, similar to (3), the first run length of "2" matches the value of RF2, and is recognized as the number of repeats. The next run length "2" also matches the value of RF1, and is recognized as the number of repeats. The following "1" is compared with the second preceding run length "2", which does not match, and is not recognized as a repeat.

Therefore, the repeat flag REFL is "1" in items 3 and 2. The item 1 is "0", and this indicates that the repeat is terminated.

Therefore, the number of repeats "4" is shown in the location item 3 of WREP at which the termination occurs. Next, since WREP has an empty of item 3, the empty of item 3 is deleted by the empty area deletion processing. Therefore, REP and RUN of OUT are shifted by one. The empty area deletion processing performs packing by the deletion when such an empty occurs so as to keep the rule of the format when transferring data to the next processing apparatus. Thereby, since the processing apparatus of the subsequent process can receive data with a simple format, the number of gates of hardware can be reduced, thereby improving a processing speed.

(5) is the fifth process, and three run lengths "1", "1" and "1" are input. Here, the first run length "1" does not match the value of RF2, and is recognized as a run length. The next run length "1" matches the value of RF1, and is recognized as the number of repeats. The next run length "1" matches the second preceding run length "1", and is recognized as a repeat. And this also repeats of consecutive 2.

Figure 17:
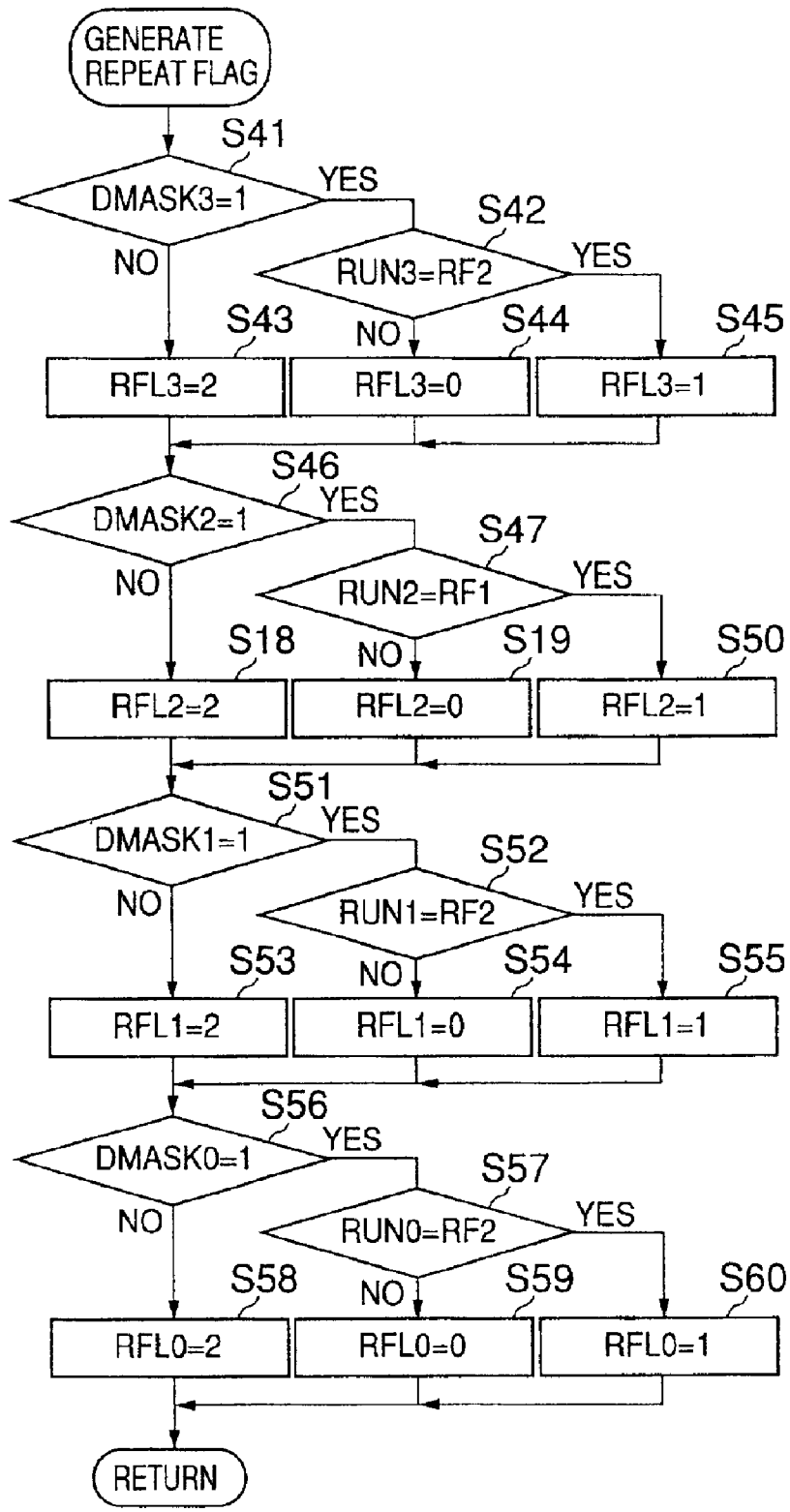
FIG. 17 is a flowchart of a repeat flag generation process.

FIG. 17 is a flowchart of a repeat flag generation process performed by the repeat flag generation apparatus 205.

First, it is determined, in step S41, whether a mask value DMASK3=1. If DMASK3 is equal to 0, this means that there is no corresponding run length, and the routine proceeds to step S43 so as to set 2 to the flag (RFL3). If DMASK3 is equal to 1 in step S41, this means that there is a run length, and the routine proceeds to step S42. In step S42, RUN3 is compared with the second run length RF2 from the end of the preceding pattern. If RUN3 matches the second run length RF2 from the end of the preceding pattern, the routine proceeds to step S45 so as to set 1 to the repeat flag (RFL3). On the other hand, if RUN3 does not match the second run length RF2 from the end of the preceding pattern, the routine proceeds to step S44 so as to set 0 to the repeat flag (RFL3). Other bits are processed in the same manner. That is, the process of steps S41 through S45 are performed in steps S46 through S60.

Figure 18:
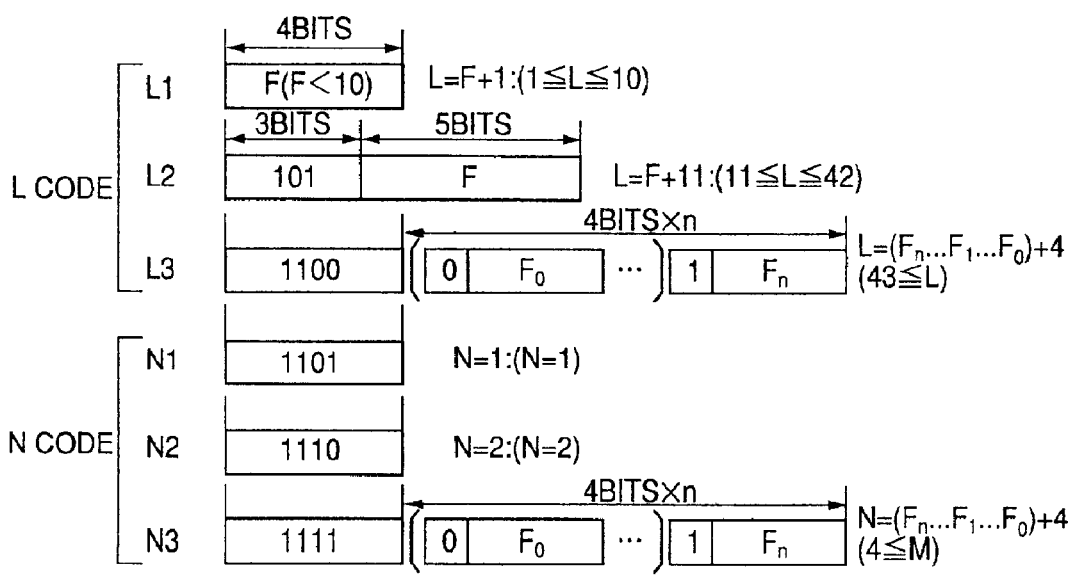
FIG. 18 is an illustration for explaining a state of obtaining a plurality of repeat numbers in accordance with a repeat flag.

FIG. 18 is an illustration for explaining a state of obtaining a plurality of repeat numbers in accordance with the repeat flag. The number of repeats turns into the repeat number when the repeat stops at each location.

Figure 19:
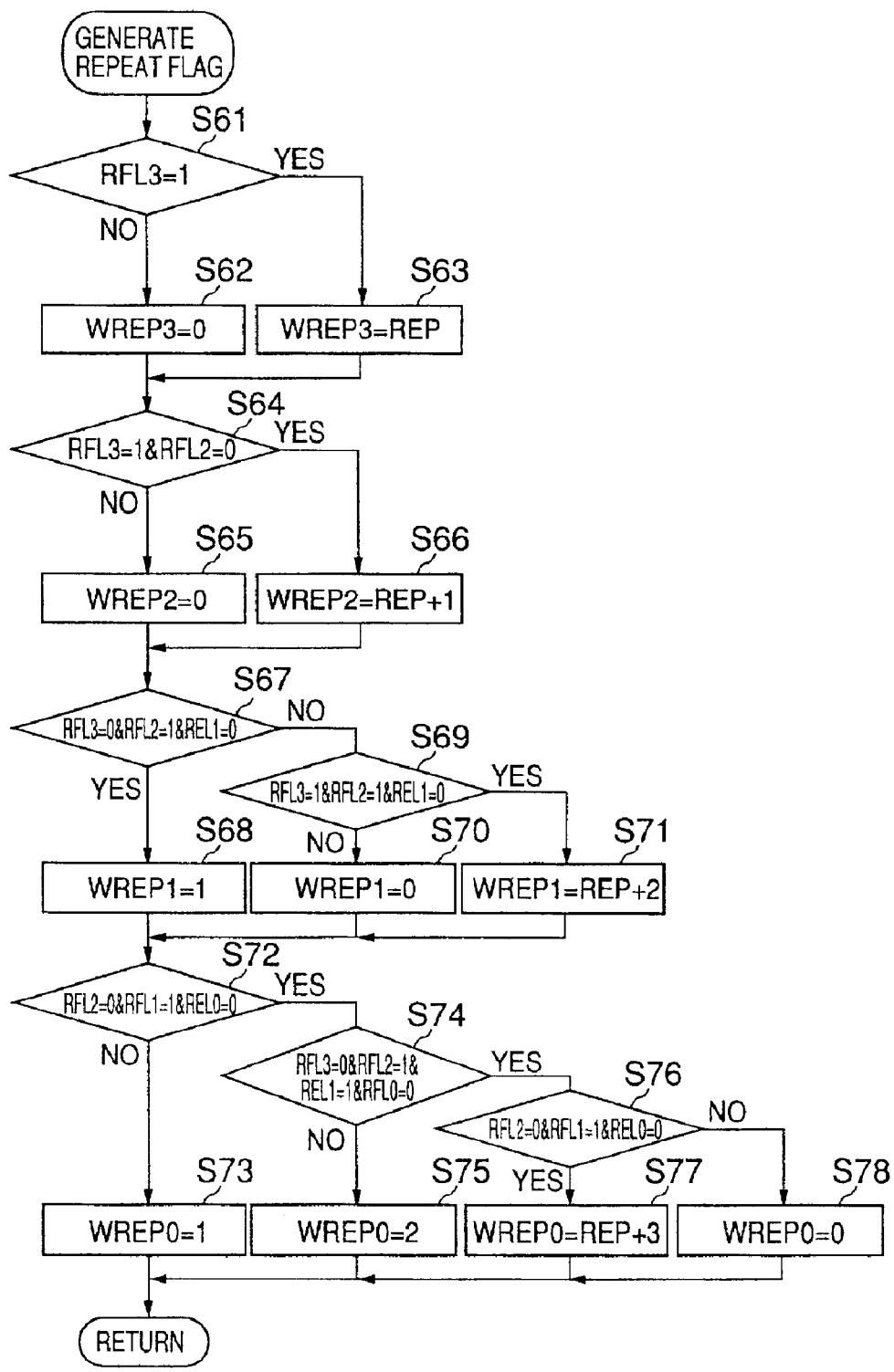
FIG. 19 is a flowchart of a repeat number generation process.

FIG. 19 is a flowchart of a repeat number generation process. In the process of steps S61, S62 and S63, if the repeat number (RFL3), which indicates the number of repeats of the third bit, is 0, the comparison result in the repeat flag generation apparatus 205 is negative, and, thereby, the old number of repeats until now is cleared and the old repeat number (REP) is substituted for the repeat number (WREF3) in step S63.

If RFL3 is 1, repeat number (WREP3) is set to 0 in step S62 since the repeat continues. The second bit of the repeat number is obtained in the process of steps S64, S65 and S66. If the repeat flag RFL3=1 and RFL2=0, the old repeat number (REP) and the present repeat number 1 (since RFL3=1) are summed, and is substituted for the repeat number (WREP2) in step S66. Otherwise, the repeat number (WREP2) is set to 0 in step S66. The first bit of the repeat number is obtained by the process of steps S67, S68, S69 and S71. The zero bit of the repeat number is obtained by the process of steps S72, S73, S74, S75, S76, S77 and S78.

Figure 20:
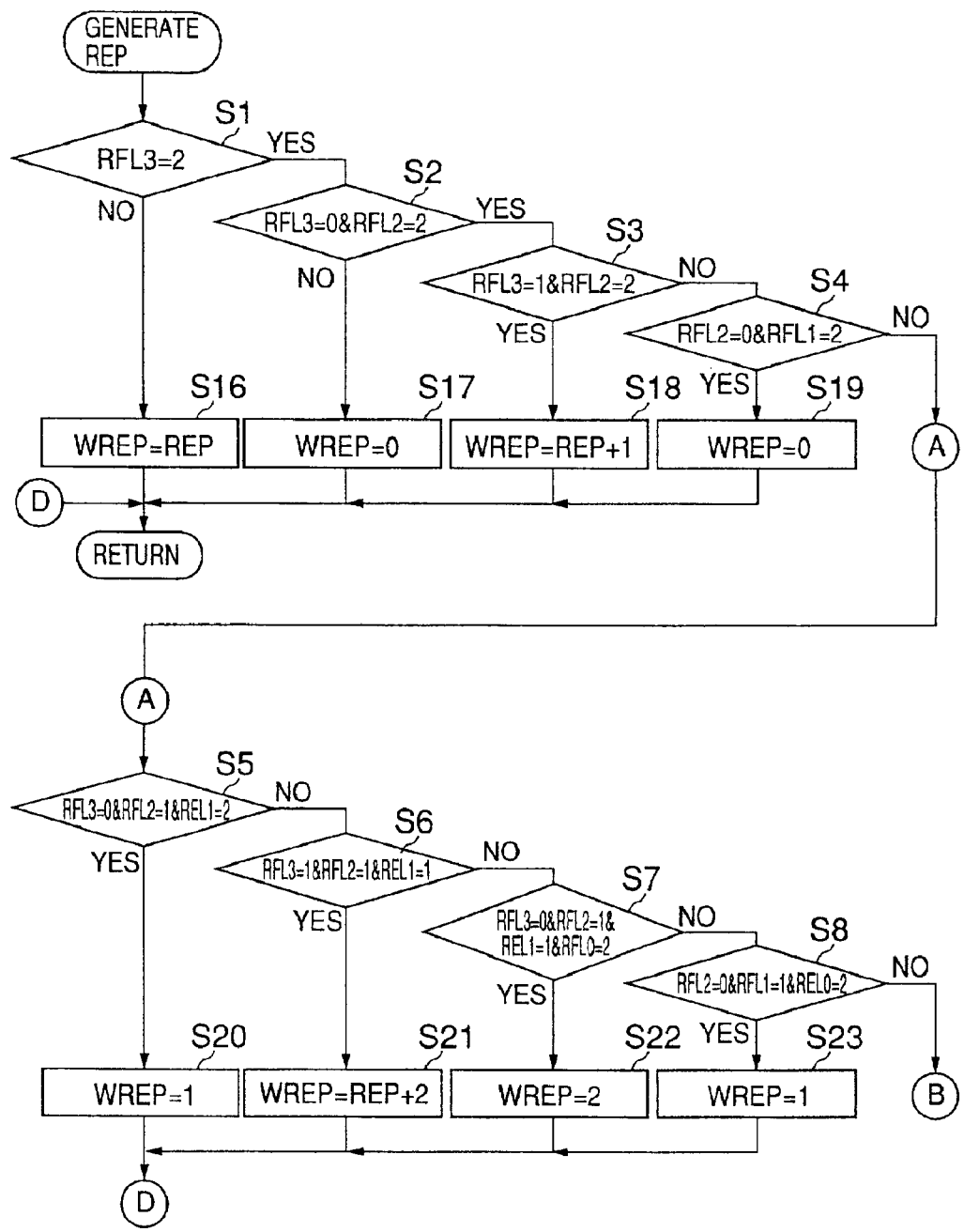
FIG. 20 is a part of a flowchart of a process for obtaining the repeat number, which is carried over to a subsequent pattern.
Figure 21:
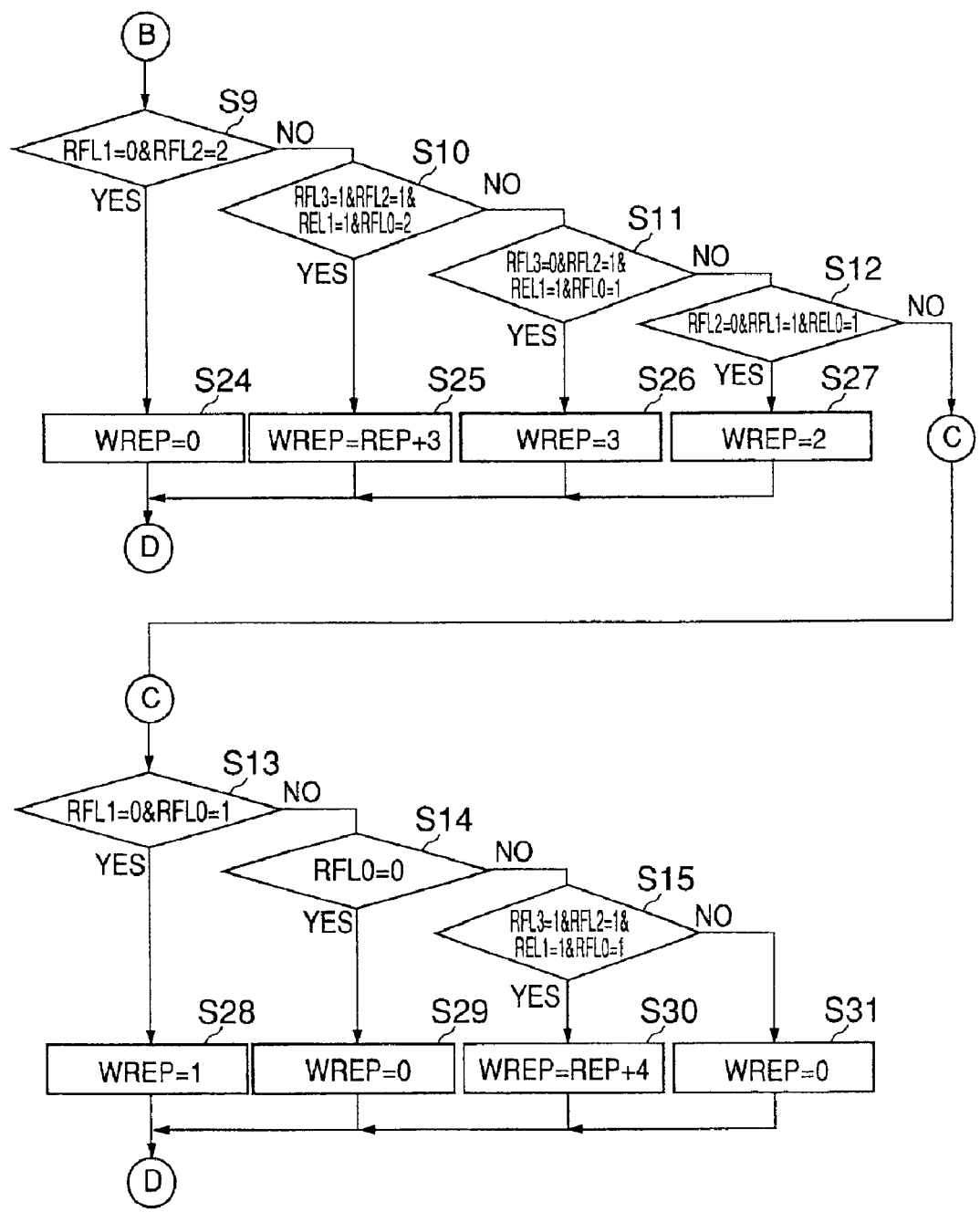
FIG. 21 is a part of the flowchart of the process for obtaining the repeat number.

FIGS. 20 and 21 are parts of a flowchart of a process for obtaining the repeat number (REP), which is carried over to a subsequent pattern.

First, in step S1, if the repeat flag (RFL3) is 2, the process proceeds to step S16. In step S16, since the run length value of the highest priority is not decided, the old repeat number (REP) is held. If the repeat flag RFL is 0 and RFL2 is 2 in step S2, this means that the run length of the highest priority is no a repeat and there is no run length thereafter, and, thus, the process proceeds to step S17 so as to set the repeat number to 0.

If the repeat flag RFL3 is 1 and RFL2 is 2 in step 3, this means that the run length of the highest priority is a repeat and there is no run length thereafter, and, thus, the process proceeds to step S18. In step S18, the present repeat number 1 is added to the old repeat number (REP) and is substituted for the repeat number (WREP). If the repeat flag RFL2 is 0 and RFL1 is 2 in step 4, this means that the valid termination is 0 even if RFL is any value, and the process proceeds to step S19 so as to set the repeat number (WREP), which is carried over to a subsequent pattern, to 0. Similar process is performed for all combinations in the process of steps S5 through S8 and steps S20 through S31.

Figure 22:
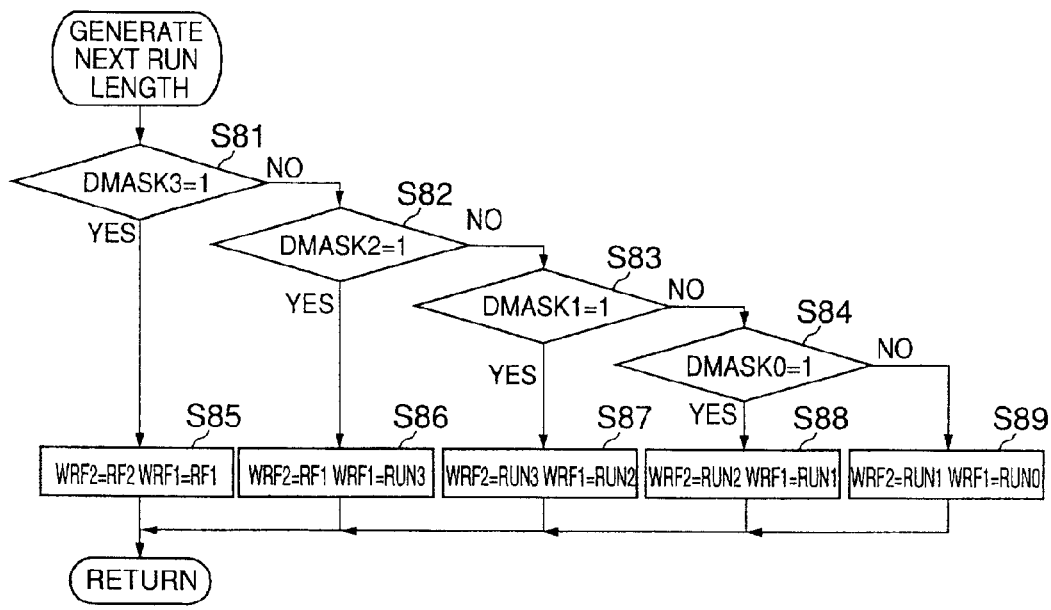
FIG. 22 is a flowchart of a process performed by a next run length generation apparatus.

FIG. 22 is a flowchart of a process performed by the next run length generation apparatus 209. First, in step S81, if the highest priority mask (DMASK3) is 0, this means that there is no closed run length in this pattern, and the process proceeds to step S85. In step S85, the second and first from the rear end of the preceding pattern are carried over. In step S82, if DMASK2 is 0, there is one run length, and the process proceeds to step S86 so as to substitute the value of RUN3 for the immediately preceding run length and substitute the value of RF1 for the second preceding run length.

In step S83, if DMASK1 is 0, there are two run lengths, and the process proceeds to step S87 so as to substitute the value of RUN2 for the immediately preceding run length and substitute the value of RUN3 for the second preceding run length. In step S84, if DMASK0 is 0, there are three run lengths, and the process proceeds to step S88 so as to substitute the value of RUN1 for the immediately preceding run length and substitute the value of RUN2 for the second preceding run length. Moreover, in step S82, if DMASK0 is 1, there are four run lengths, and the process proceeds to step S89 so as to substitute the value of RUN0 for the immediately preceding run length and substitute the value of RUN1 for the second preceding run length.

Figure 23:
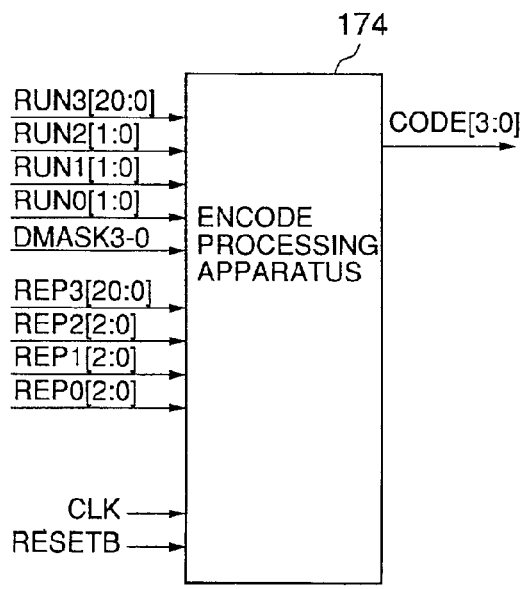
FIG. 23 is a block diagram showing signal I/O of an encode processing apparatus 174.

FIG. 23 is a block diagram showing signal I/O of the encode processing apparatus 174. The encode processing apparatus 174 receives a maximum of four run lengths and repeat number and a mask value thereof, and outputs format codes for each four bits as shown in FIG. 14 (the format of the code may be any number of bits).

Figure 24:
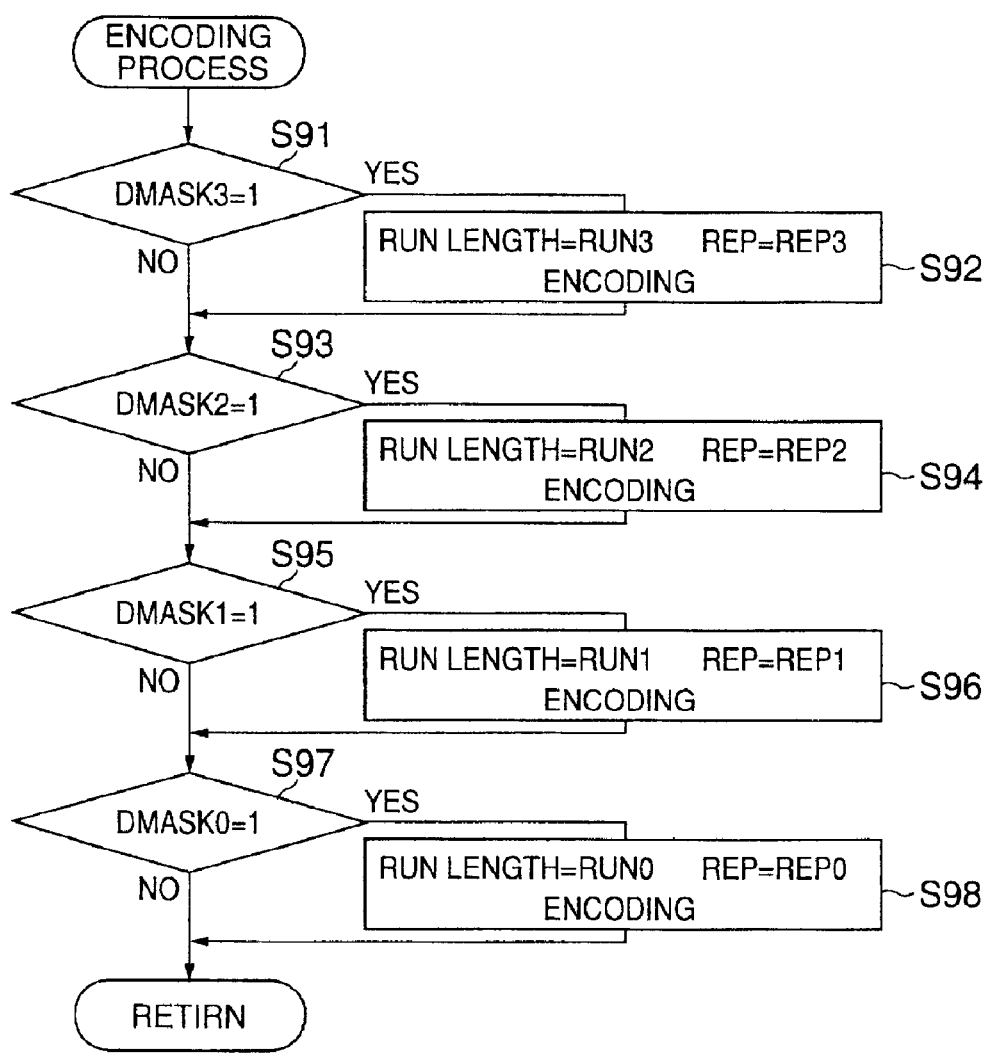
FIG. 24 is a flowchart of an encoding process performed by the encode processing apparatus.

FIG. 24 is a flowchart of an encoding process performed by the encode processing apparatus 174. The process of steps S91 through S98 of FIG. 24 is an encoding process in which the run length and repeat number are encoded in accordance with the value of DMASK3-0.

Figure 25:
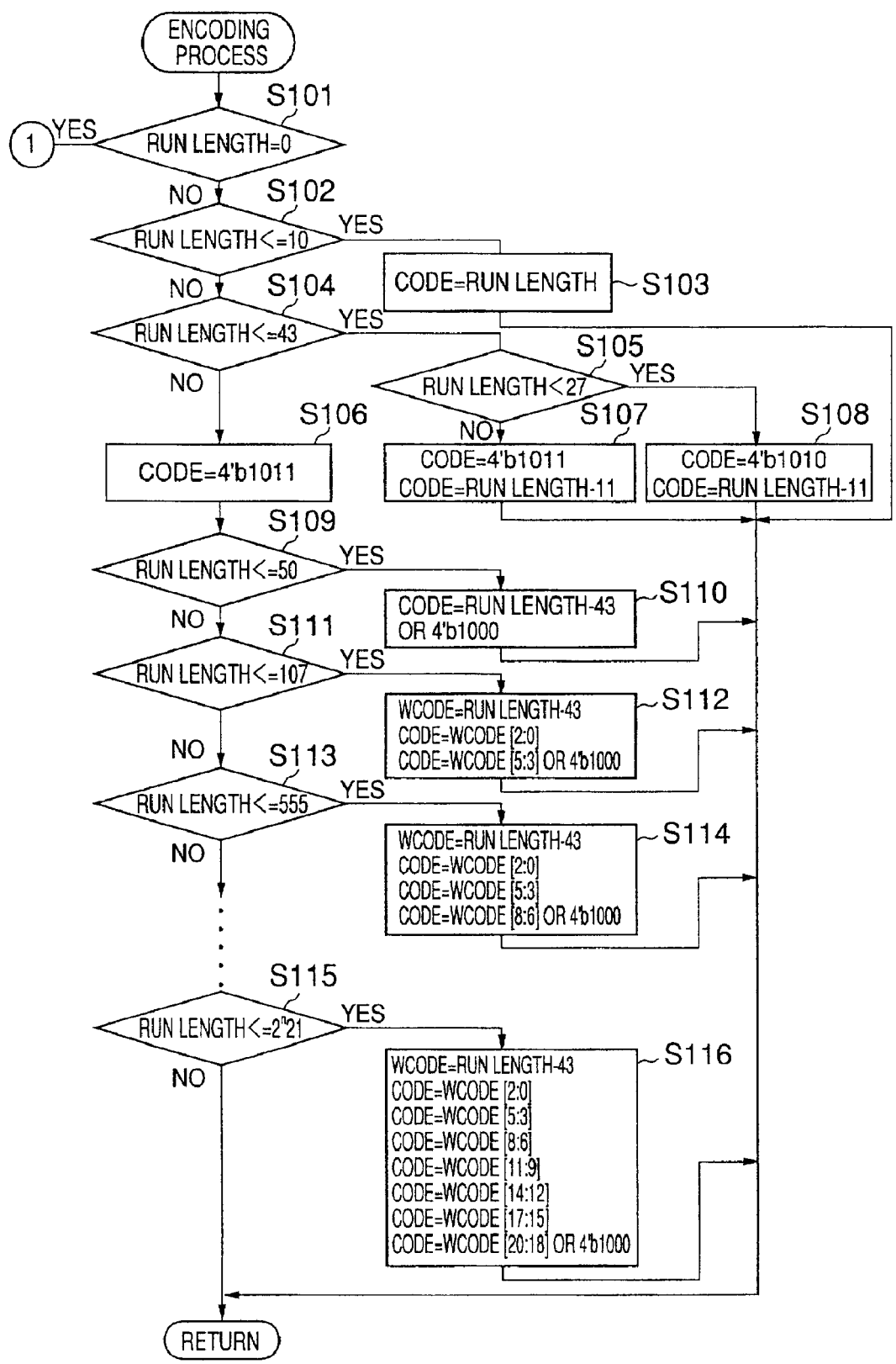
FIG. 25 is a part of a flowchart of encoding performed by the encode process apparatus.
Figure 26:
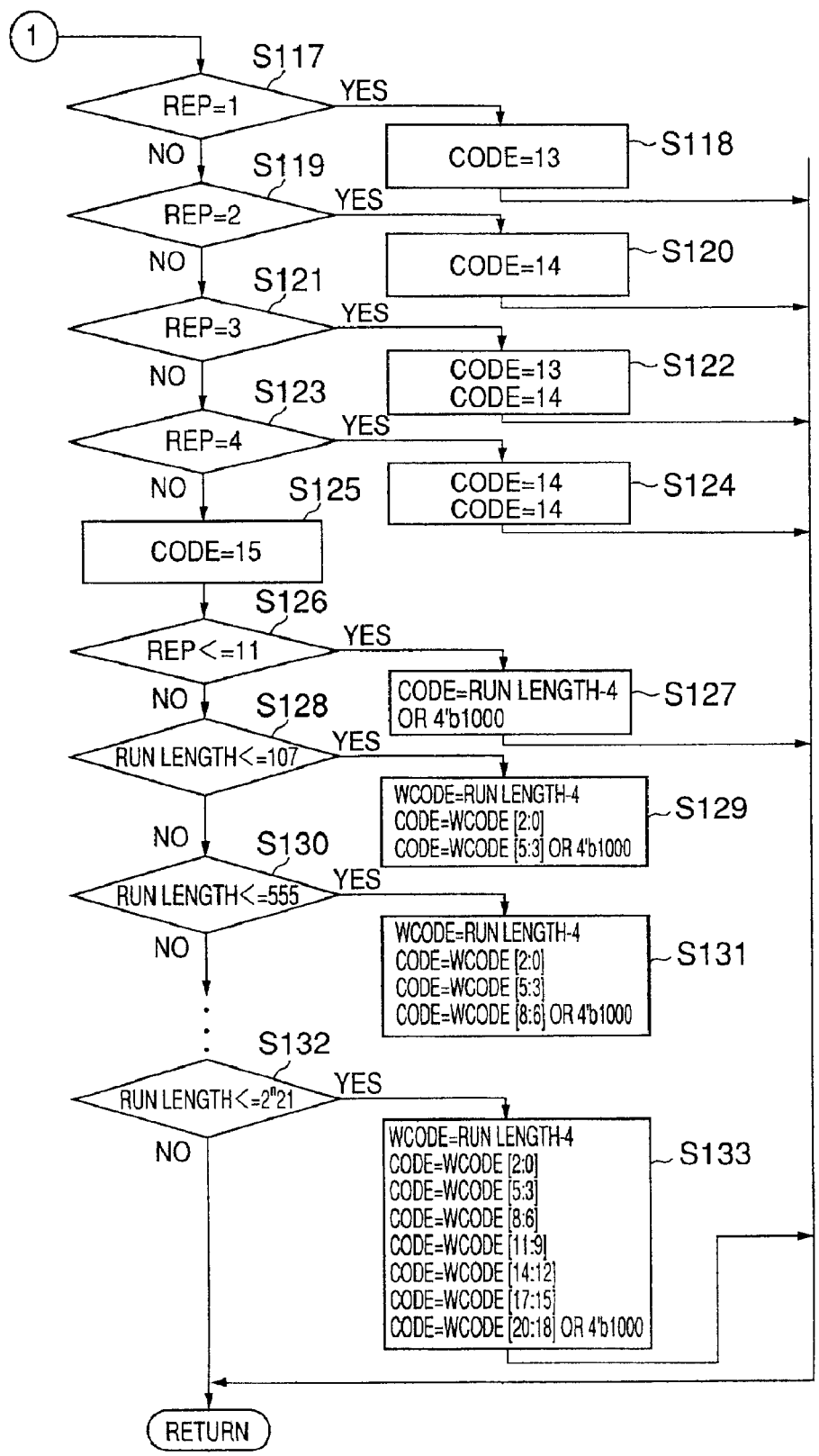
FIG. 26 is a part of the flowchart of encoding performed by the encode process apparatus.

FIGS. 25 and 26 are parts of a flowchart of encoding performed by the encode process apparatus 174. In FIG. 25, first, if the run length is 0 in step S101, it is determined, in step S102, whether or not the run length is equal to or smaller than 10. If the run length is equal to or smaller than 10, the run length is encoded as it is in step S103.

If it is determined, in step S104, that the run length is greater than 10 and equal to or smaller than 43, the process proceeds to step S105 so as to determine whether or not the run length is smaller than 27. If the run length is smaller than 27, the process proceeds to step 108 so as to add four bits "1010" as a header and set a value of run length minus 11 as a code. If the run length is equal to or greater than 27, the process proceeds to step 107 so as to add four bits "1011" as a header and set a value of run length minus 11 as a code.

If it is determined, in step S104, that the run length is greater than 43, the process proceeds to step S106 so as to add four bits "1100" as a header. Then, the process of steps S109 through S116 is performed so as to represent the code length by a smaller value by an expression in which the fourth bit is rendered as a termination flag.

Furthermore, in FIG. 26, if it is determined, in step S117, that the repeat number (REP) is 1, 13 is set as a code in step S118. If it is determined, in step S119, that the repeat number (REP) is 2, 14 is set as a code in step S120. If it is determined, in step S121, that the repeat number (REP) is 3, 13 and 14 are set as a code in step S122. If it is determined, in step S123, that the repeat number (REP) is 4, 14 and 14 are set as a code in step S124. If it is determined, in step S123, that the repeat number (REP) is 4, the process proceeds to step S125 so as to add fur bits "1111" as a header. Furthermore, in the process of steps S126 through S133, the fourth bit of the four bits is set as a termination flag so as to express the code length smaller.

Figure 27:
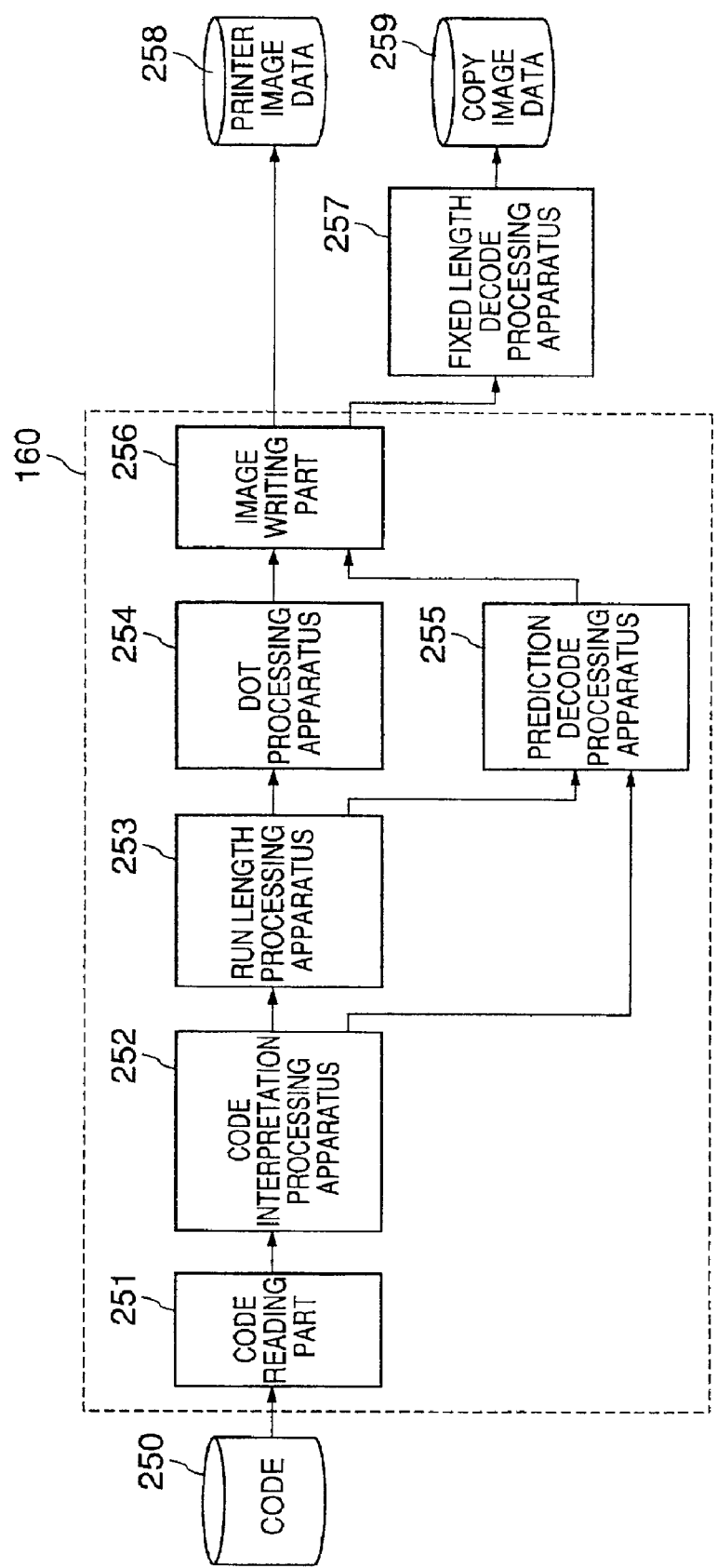
FIG. 27 is a block diagram of an encoding/decoding apparatus for decoding code data.

FIG. 27 is a block diagram of the encoding/decoding apparatus 160 for decoding code data. Memory 250 stores code data. A code reading part 251 reads the code data from the memory 250. A code interpretation processing apparatus 252 interprets the read code so as to converts the code into run lengths (values 0 and 1) or the repeat number, and transfers the converted code to a run length processing apparatus 253. Moreover, at the time of copy mode, the code interpretation processing apparatus 252 judges a quantization code, and transfers the results of determination to the prediction decode processing apparatus 255.

At the time of printer mode, the run length processing apparatus 253 develops the repeat number to only the run length based on the run lengths and the repeat number of the code interpretation processing apparatus 252, and transfers only the necessary run lengths to a dot processing apparatus 254. At the time of copy mode, the run length processing apparatus 253 develops the repeat number to a prediction code based on the prediction code and the repeat number. Moreover, the run length processing apparatus 253 transfer a prediction code required for decoding a plurality of fixed length codes to the prediction decode processing apparatus 255.

The dot processing apparatus 254 changes the run lengths into dot data, and transfers the dot data to an image writing part 256. The prediction decode processing apparatus 255 decodes a given prediction code and quantization code into a plurality of fixed length codes. The image writing part 256 writes the image decoded at the time of printer mode in the memory 258. Moreover, the image writing part 256 transfers the decoded value at the time of copy mode to a fixed length code decode processing apparatus 257. A memory 258 stores printer image data. The fixed length code decode processing apparatus 257 decodes fixed length codes such as GBTC. A memory 259 stores copy image data.

A description will be given below of each block shown in FIG. 27. It should be noted that, in this example, image data is processed in parallel on each four bits basis.

Figure 28:
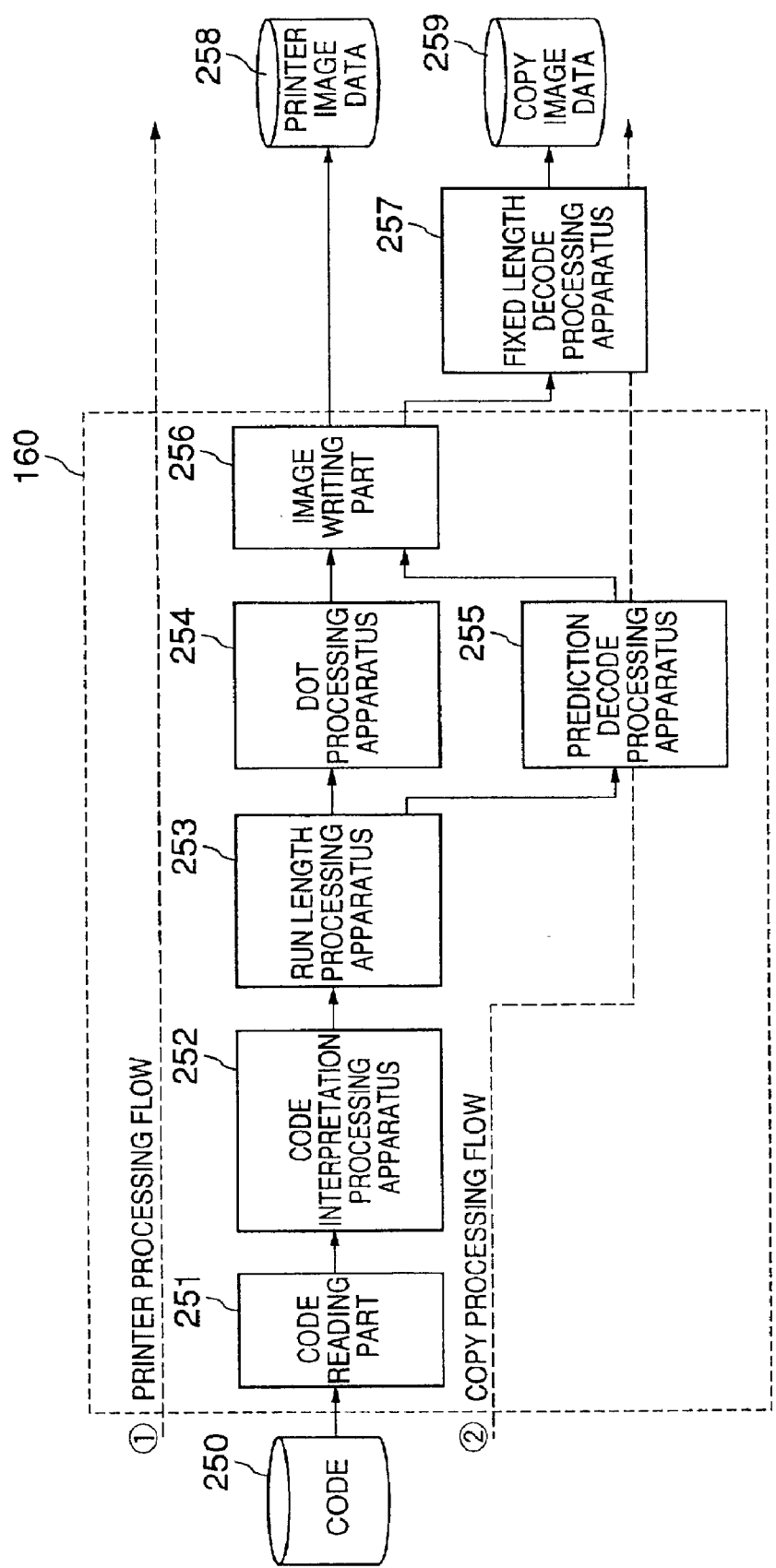
FIG. 28 shows a processing flow at the time of printer mode and a processing flow at the time of copy mode.
Figure 29:
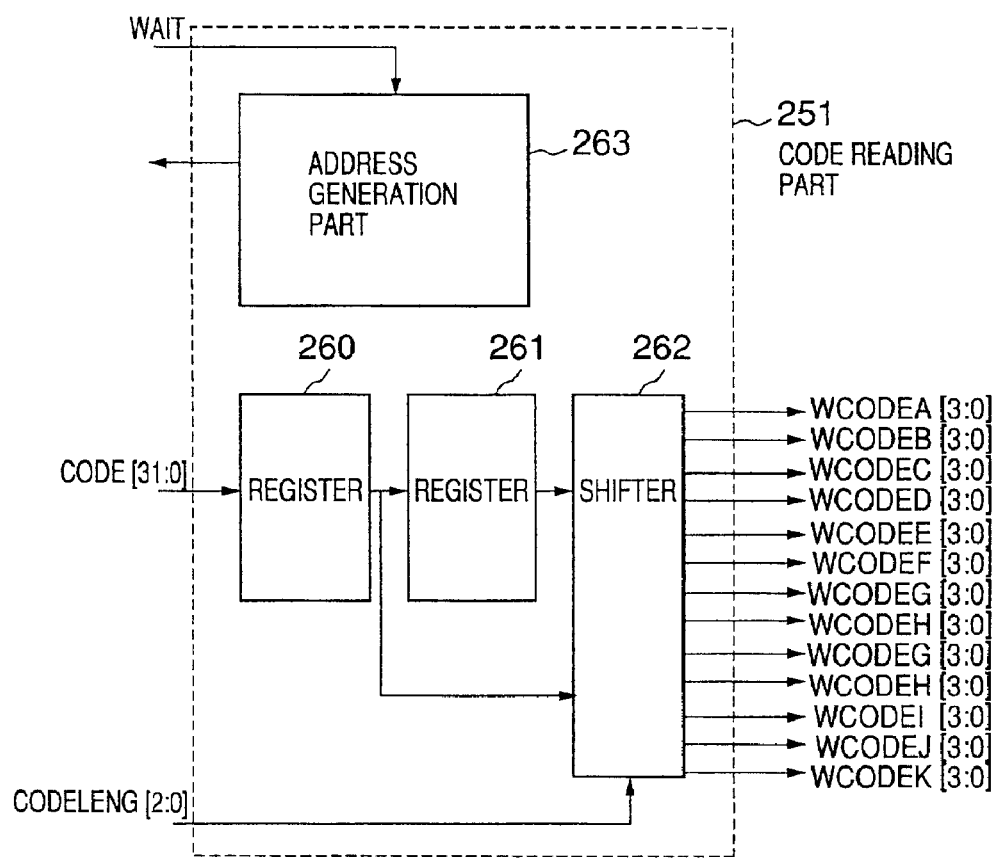
FIG. 29 is a block diagram of a code reading part

FIG. 28 shows a processing flow at the time of printer mode a processing flow at the time of copy mode. FIG. 29 is a block diagram of the code reading part 251. The code reading part 251 reads the code of a format, and outputs it as a code on each four bits basis. At this time, the code reading part 251 sequentially shifts the bit code by a shifter 262 based on the consumed code length (CODELEG) from the code interpretation processing apparatus 252. Moreover, the code reading part 251 stops reading of the code according to a WAIT signal from a FIFO when the FIFO becomes full.

Registers 260 and 261 temporarily store the read code data. The shifter 262 transfers the code for each 4 bits to the code interpretation processing apparatus 252 while sequentially shifting 4-bit code according the consumed code length (CODELENG) from the code interpretation processing apparatus 252. An address generation part 263 generates the address of the code memory.

Figure 30:
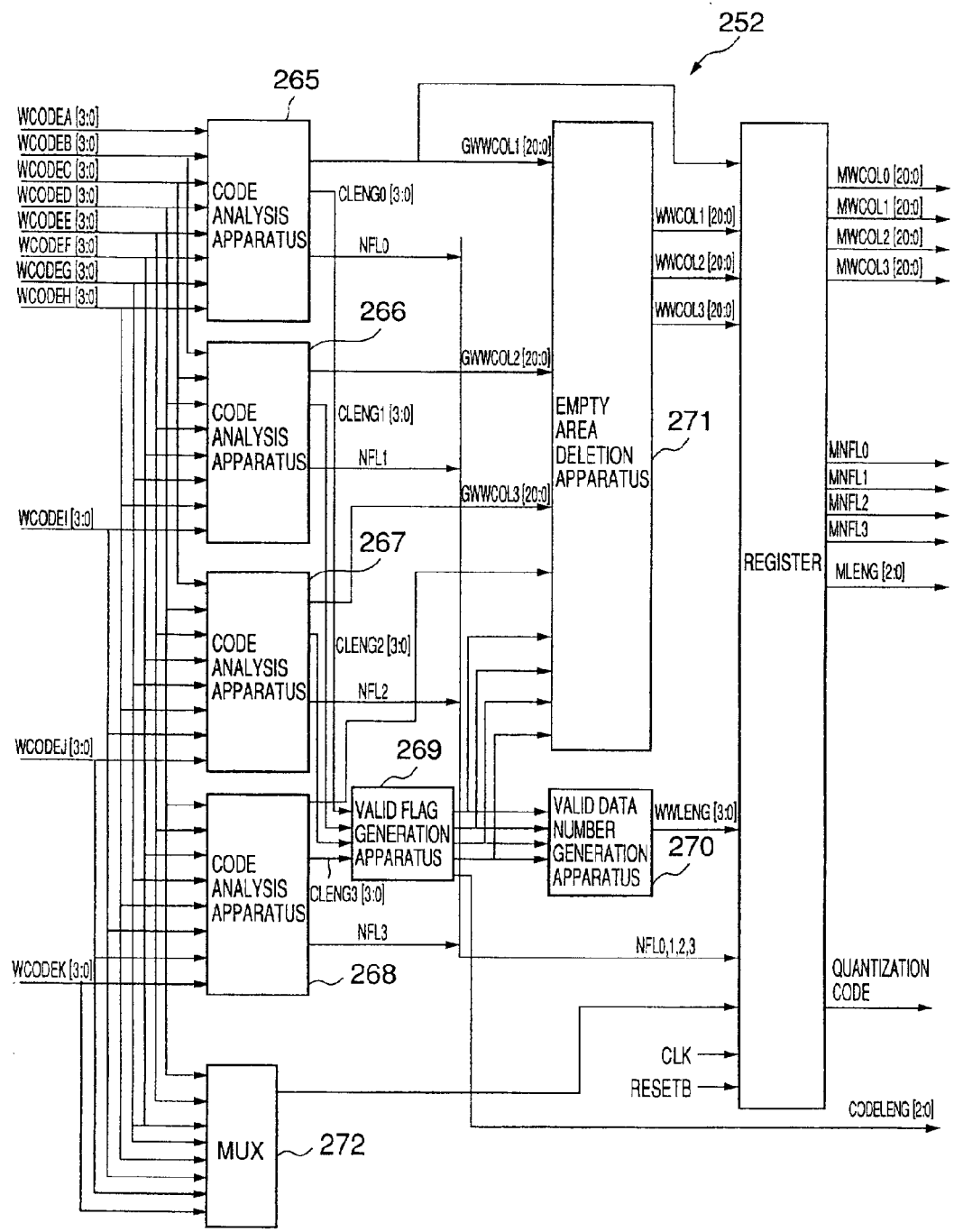
FIG. 30 is a block diagram of a code interpretation processing apparatus.
Figure 31:
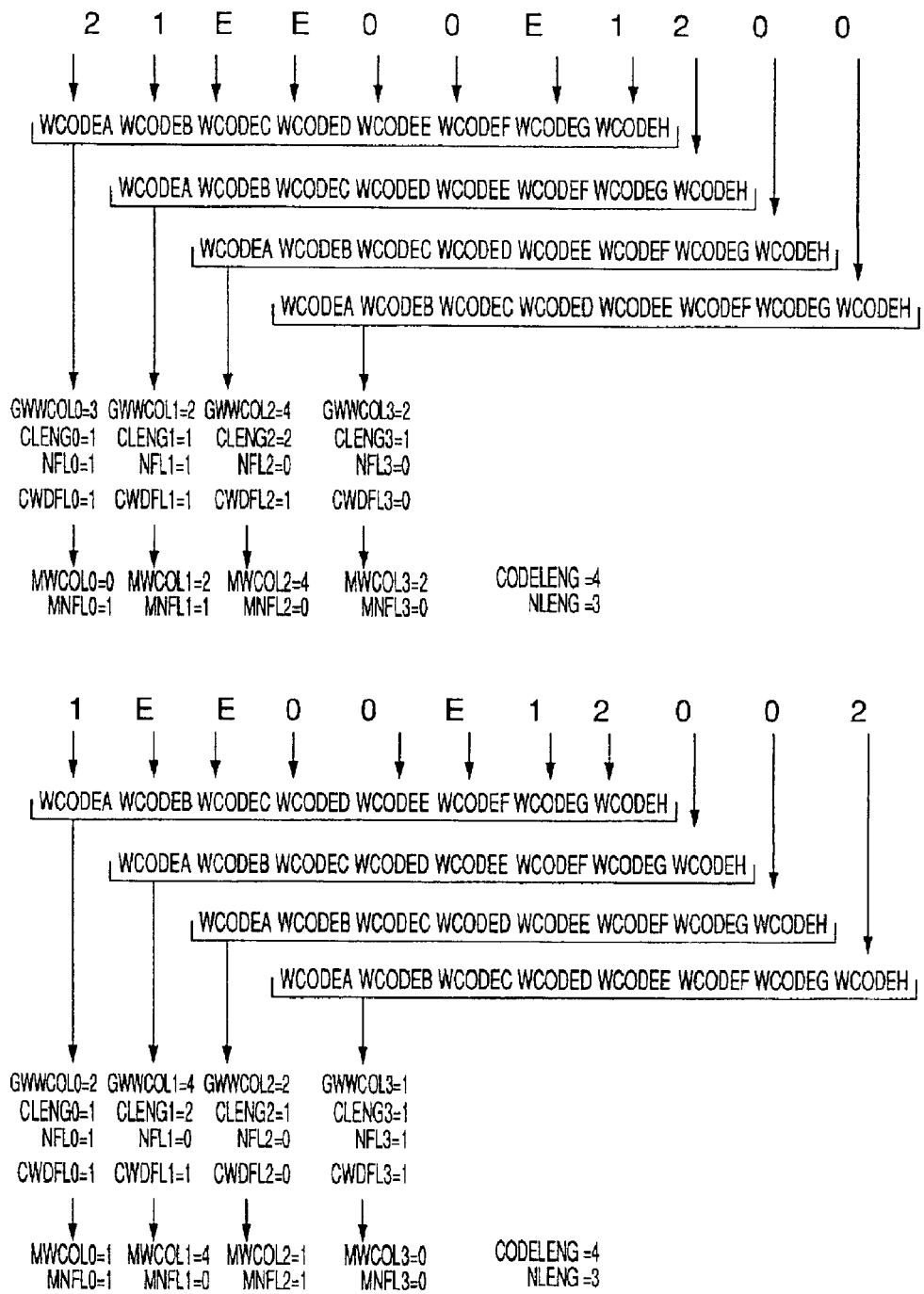
FIG. 31 is an illustration for explaining a process performed by a code interpretation processing apparatus.

FIG. 30 is a block diagram of the code interpretation processing apparatus 252. The code interpretation processing apparatus 252 reads a plurality of codes of 4-bit unit from the code reading part so as to obtain four run lengths or the repeat number an a plurality of flags indicating whether a run length or the repeat number, as shown in FIG. 31.

In the processing flow, the four code analysis apparatuses 265–268 analyze the codes in the format shown in FIG. 15. At this time, one of the code analysis apparatuses is set so as to read a code having the maximum code length. It should be noted that, in the format shown in FIG. 15, the maximum code length corresponds to eight 4-bit codes. The four codes are analyzed by being shifted by one 4-bit code. Each of the code interpretation processing apparatuses may match boundaries of the codes or may not match. The valid flag generation apparatus 269 judges such a condition.

The valid flag generation apparatus 269 judges whether it is valid or not from the value of the code length (CLENG0–3) from four code analysis apparatuses 265–268. The valid flag generation apparatus 269 outputs the run lengths or the repeat number output from each of the code analysis apparatuses 265–268 and the flag (CMDFL0–3) which indicates validity/invalidity indicating whether or not it corresponds to the repeat number. A valid data number generation apparatus 270 converts the output of the code analysis apparatuses 265–268 into a length (MLENG), and transfers to a FIFO the run lengths or the repeat number and the run lengths, the flag (CMDFL0–3) indicating validity/invalidity of the flag (NFL0–3) indicating the repeat number and a number of valid data (MENG). Moreover, the summed code length (CODELEG) obtained by the valid flag generation apparatus 269 is transferred to the code reading apparatus so as to produce next codes.

The code analysis apparatuses 265–268 analyze the codes according to the format shown in FIG. 18, and outputs the run lengths or the repeat number and the run lengths (GWWCOL), the flag (NFL) that shows whether it is the repeat number, and the processed code length (CLENG). At this time on of the code analysis apparatuses is enabled to read a code having the maximum code length. It should be noted that in the format shown in FIG. 18, the maximum code length corresponds to eight 4-bit codes. Four codes are analyzed while being shifted by one 4-bit code.

The valid flag generation apparatus 269 receives the processed code length (CLENG) from the code analysis apparatuses 265–268. The code interpretation apparatus 265 is in the right location, and analyzes the right code. If the code length processed by the code interpretation apparatus 265 is 1, the code interpretation apparatuses 266 is valid and is invalid if the code length is greater than 1. If the number obtained by summing the code length processed by the code interpretation apparatus 265 and the code length (if invalid 0) processed by the code interpretation apparatus 266 is 1 or 2, the code interpretation apparatus 267 is valid, and is invalid if the number is other than 1 or 2. If the number obtained by summing the code length processed by the code interpretation apparatus 265 and the code length (if invalid 0) processed by the code interpretation apparatus 266 and the code length (if invalid 0) processed by the code interpretation apparatus 267 is 1 or 2 or 3, the code interpretation apparatus 268 is valid, and is invalid if the number is other than 1 or 2 or 3.

The valid data number generation apparatus 270 converts the valid flag from the valid flag generation apparatus into a length (MLENG). The empty area deletion apparatus 271 shifts a part judged that no information is contained according to a plurality of repeat numbers received from the code analyze apparatus and valid/invalid flag (CMDFL 0–3) from the valid flag generation apparatus 269. A multiplexer (MUX) 272 judges and chooses the location of a quantization code at the time of copy mode, and transfers it to the prediction decode processing apparatus 255.

FIG. 26 shows an example of the above-mentioned process. GWWCOL is the run length or the repeat number of a code analyzed by the code analysis apparatus. CLENG is the length of the analyzed code. NFL is a flag which indicates whether the value of GWWCOL correspond to a run length or a repeat number. CMDFL is a flag which indicates a validity of a result of analysis of each code analysis apparatus obtained by the valid flag generation apparatus. MWCOL is the run length or the repeat number which is finally obtained. MNFL is a flag which shows whether it is a run length or a repeat number. CODELEG is a number of codes which area obtained and analyzed by the valid flag generation apparatus. MLENG is the number of the run length or the repeat number.

In the first process, the code "2", "1", "E", "E", "0", "0", "E", "1", "2", "0", "0" is received and analyzed.

The first code analysis apparatus 265 receives and analyzes a code "2", "1", "E", "E", "0", "0", "E", "1". In this case, the run length is 3 and the number of codes is 1.

The second code analysis apparatus 266 receives and analyzes a code "1", "E", "E", "0", "0", "E", "1", "2". In this case, the run length is 2 and the number of codes is 1.

The third code analysis apparatus 267 receives and analyzes a code "E", "E", "0", "0", "E", "1", "2", "0". In this case, the repeat number is 4 and the number of codes is 2.

The fourth code analysis apparatus 268 receives and analyzes a code "E", "0", "0", "E", "1", "2", "0", "0". In this case, the repeat number is 2 and the number of codes is 1.

Then, a validity of the run length or the repeat number analyzed by each code analysis processing apparatus is obtained from the number of codes obtained by each code analysis apparatus. In this example, the result of the fourth code analysis apparatus 268 is 2 which is the number of codes corresponding to the run length/repeat number obtained by the third code analysis apparatus 267. Thereby, it can be interpreted that the code which the fourth code analysis apparatus 268 analyzed is not a head of the code. Therefore, CMDFL3 of the fourth code analysis apparatus 268 is invalidated. Then, the number of the codes consumed here is 4.

In the next process, a code "1", "E", "E", "0", "0", "E", "1", "2", "0", "0", "2" is received and analyzed.

The first code analysis apparatus 265 receives and analyzes a code "1", "E", "E", "0", "0", "E", "1", "2". In this case, the run length is 2 and the number of codes is 1.

The second code analysis apparatus 266 receives and analyzes a code "E", "E", "0", "0", "E", "1", "2", "0". In this case, the repeat number is 4 and the number of codes is 2.

The third code analysis apparatus 267 receives and analyzes a code "E", "0", "0", "E", "1", "2", "0", "0". In this case, the number of repeats is 2 and the number of codes is 1.

The fourth code analysis apparatus 268 receives and analyzes a code "0", "0", "E", "1", "2", "0", "0", "2". In this case, the run length is 1 and the number of codes is 1.

Then, a validity of the run length or the repeat number analyzed by each code analysis processing apparatus is obtained from the number of codes obtained by each code analysis apparatus. In this example, the result of the third code analysis apparatus 267 is 2 which is the run length/repeat number obtained by the second code analysis apparatus 266. Thereby, it can be interpreted that the code which the third code analysis apparatus 268 analyzed is not a head of the code. Therefore, CMDFL2 of the third code analysis apparatus 268 is invalidated.

Since a blank exists in the obtained run length/repeat number, the blank is deleted by the empty area deletion apparatus 271 so as to simplify the data format sent to a subsequent processing apparatus. The number of the codes consumed here is 4.

Figure 32:
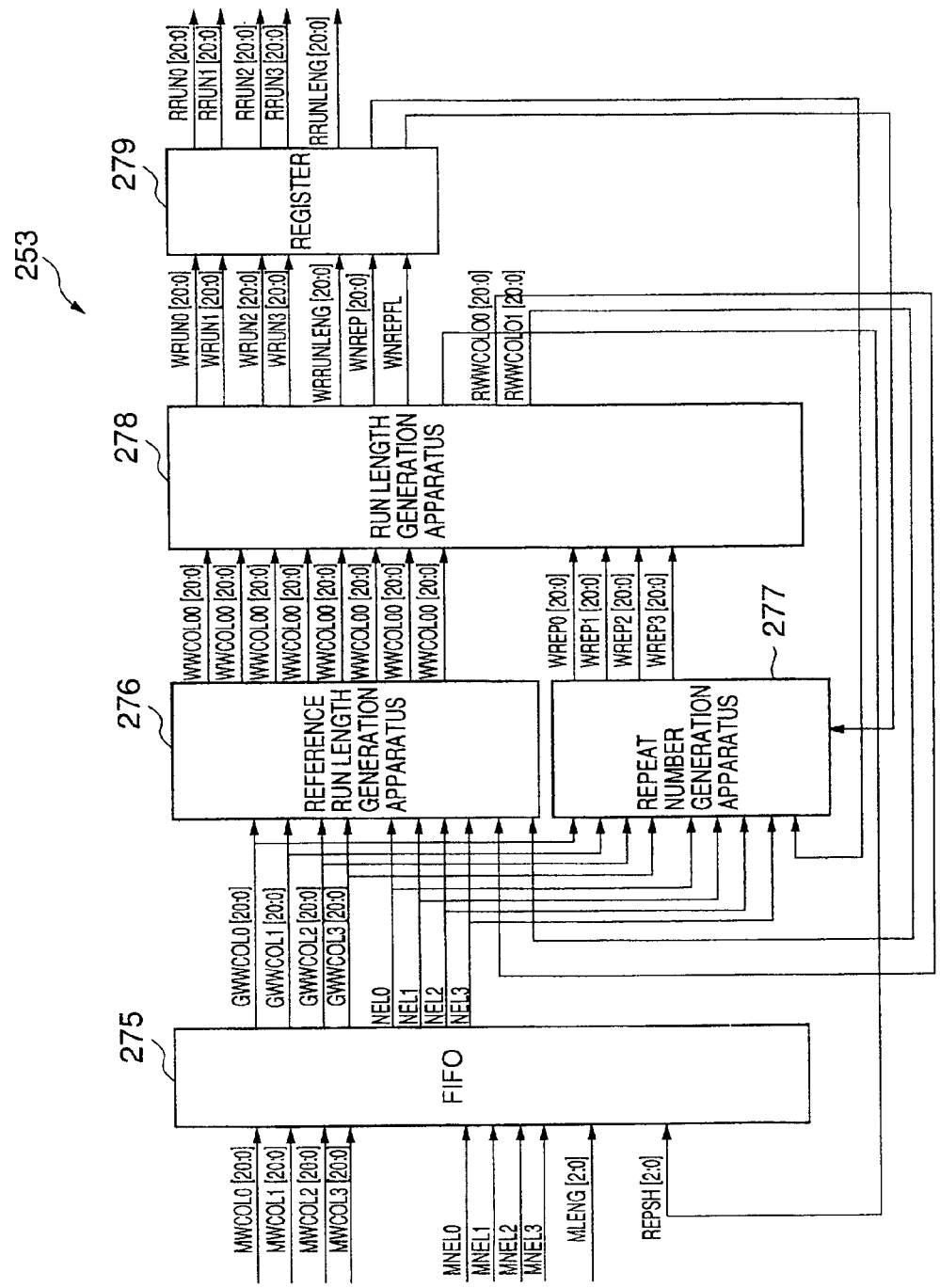
FIG. 32 is a block diagram of a run length processing apparatus.

FIG. 32 is a block diagram of the run length processing apparatus 253. The run length processing apparatus 253 receives a plurality of run lengths or repeat numbers and a plurality of flags indicating whether it is a run length or a repeat number from the code interpretation processing apparatus 252. The run length processing apparatus 253 develops the repeat number so as to generate 4 run lengths, and sends the generated run lengths to the dot processing apparatus 254. Thereby, a maximum number of four run lengths can be generated which are necessary for generating decoded 4-bit pattern in synchronization with a clock.

FIFO 275 receives a plurality of run lengths or repeat numbers and a plurality of flags indicating whether it indicates the run length or the repeat number and the number (MLENG) from the code interpretation processing apparatus 252, and sequentially stores the received data therein. The FIFO 275 sends the four run lengths or repeat numbers and the plurality of flags to a reference run length generation apparatus 276 and a repeat number generation apparatus 277, and outputs the stored data by shifting the number of REPSH which is a number of consumed data from the run length generation apparatus 278. The reference run length generation apparatus 276 receives the run lengths or the repeat numbers and the plurality of flags from the FIFO 275 and also receives the last run lengths RWWCOL0 and RWWCOL1 of the preceding process from the reference run length generation apparatus 276, and converts the received data into the following format to which repeat processing can be easily applied.

Namely, following is an example in which the last run length is 5; four run lengths from the FIFO is 3, 2, 4, 1; the repeat/ran length flag is 0, 0 , 1 ,0 (the third number indicates a repeat).

| WWCOL | | | 0 | 1 | 2 | 3 |
|---|---|---|---|---|---|---|
| color | 0 | : | 3 | 3 | 3 | 1 |
|  | 1 | : | 5 | 2 | 2 | 2 |

A repeat processing is applied to the above by the reference run length generation apparatus 276 as follows.

| WWCOL | | | 0 | 1 | 2 | 3 | 4 | 5 | 6 |
|---|---|---|---|---|---|---|---|---|---|
| color | 0 | : | 3 | 3 | 3 | 3 | 3 | 3 | 1 |
|  | 1 | : | 5 | 2 | 2 | 3 | 2 | 2 | 2 |

The image is a repeat of white and black run lengths, and there are white run length and black run length. If a color following a run length begins from "0", the image data can be converted into only run lengths: color 0, WWCOL0=3; color 1, WWCOL1=2; color 0, WWCOL2=3; color 1, WWCOL3=2; color 0, WWCOL4=3, and by searching alternately like 3, 2, 3, 2, 3, 2, 1 . . . .

In this case, the conversion is performed to the following level where information regarding the run length and the repeat number can be easily converted into information regarding only the run length.

| WWCOL | | | 0 | 1 | 2 | 3 |
|---|---|---|---|---|---|---|
| color | 0 | : | 3 | 3 | 3 | 1 |
|  | 1 | : | 5 | 2 | 2 | 2 |

The repeat number generation apparatus 277 receives a plurality of run lengths or the repeat number and the run length and a flag indicating whether it indicates a run length or a repeat number so as to generate repeat information WREP.

The run length generation apparatus 278 receives information regarding black and white run lengths and information regarding repeat number, and develops the information as follows:

| WWCOL | | | 0 | 1 | 2 | 3 |
|---|---|---|---|---|---|---|
| color | 0 | : | 3 | 3 | 3 | 1 |
|  | 1 | : | 5 | 2 | 2 | 2 |
| WREP |  | : | 1 | 1 | 4 | 1 | and develops as follows:

| WWCOL | | | 0 | 1 | 2 | 3 | 4 | 5 | 6 |
|---|---|---|---|---|---|---|---|---|---|
| Color | 0 | : | 3 | 3 | 3 | 3 | 3 | 3 | 1 |
|  | 1 | : | 5 | 2 | 2 | 2 | 2 | 2 | 2 | and obtain the information regarding only the run lengths like 2, 3, 2, 3, 2, 1 . . . .

In this case, all patterns in which four dots are repeated are input as follows;

```
4,
3, 1
2, 2
2, 1, 1
1, 3
1, 2, 1
1, 1, 2
1, 1, 1, 1
```

The repeat pattern of input data is recognized. The run lengths area developed as mentioned above. A sufficient number of data numbers for filling four runs are returned to the FIFO as REPSH. Then the number of runs WRULEG, the run lengths and the last repeat number c, which is an intermediate number, are sent to the register 272.

Then, acquisition of WNREP is performed. For example, in the following example;

| WWCOL | | | 0 | 1 | 2 | 3 | 4 | 5 | 6 |
|---|---|---|---|---|---|---|---|---|---|
| color | 0 | : | 3 | 3 | 3 | 3 | 3 | 3 | 1 |
|  | 1 | : | 5 | 2 | 2 | 2 | 2 | 2 | 2 | since the following four runs are sufficient, only first two repeats from among four repeats of WREP2 are used, and the rest of two repeats are held by NREP. When there is a reminder of the repeat, a flag of WNREPFL is stood, and is sent to the repeat number generation apparatus 277 so as to be used as the first repeat number in the next process.

| WWCOL | | 0 | 1 | 2 | 3 |
|---|---|---|---|---|---|
| color | 0 : | 3 | 3 | 3 | 3 |
| | 1 : | 5 | 2 | 2 | 2 |

Figure 33:
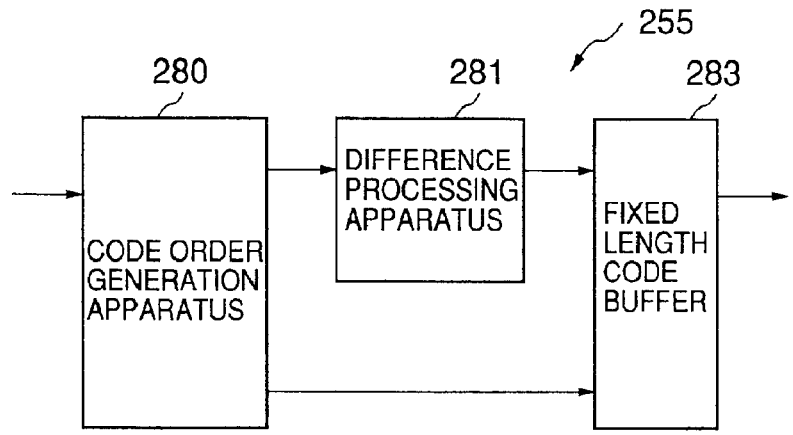
FIG. 33 is a block diagram of a prediction decode processing apparatus.

FIG. 33 is a block diagram of the prediction decode processing apparatus 255. A fixed length code buffer 283 stores a plurality of fixed length codes such as GBTC shown in FIG. 39. A difference processing apparatus 281 performs prediction decoding of a part correlates with the preceding and proceeding fixed length codes. In the example of GBTC shown in FIG. 39, prediction decoding is performed on the average level of the block of LA and a part of the gradation width index within the block of LD. The code order generation apparatus 280 receives codes in an order such as that shown in FIG. 15, and transfer the prediction code to the difference processing apparatus 281 and PIXELCIDE to the fixed length code buffer 283

Figure 34:
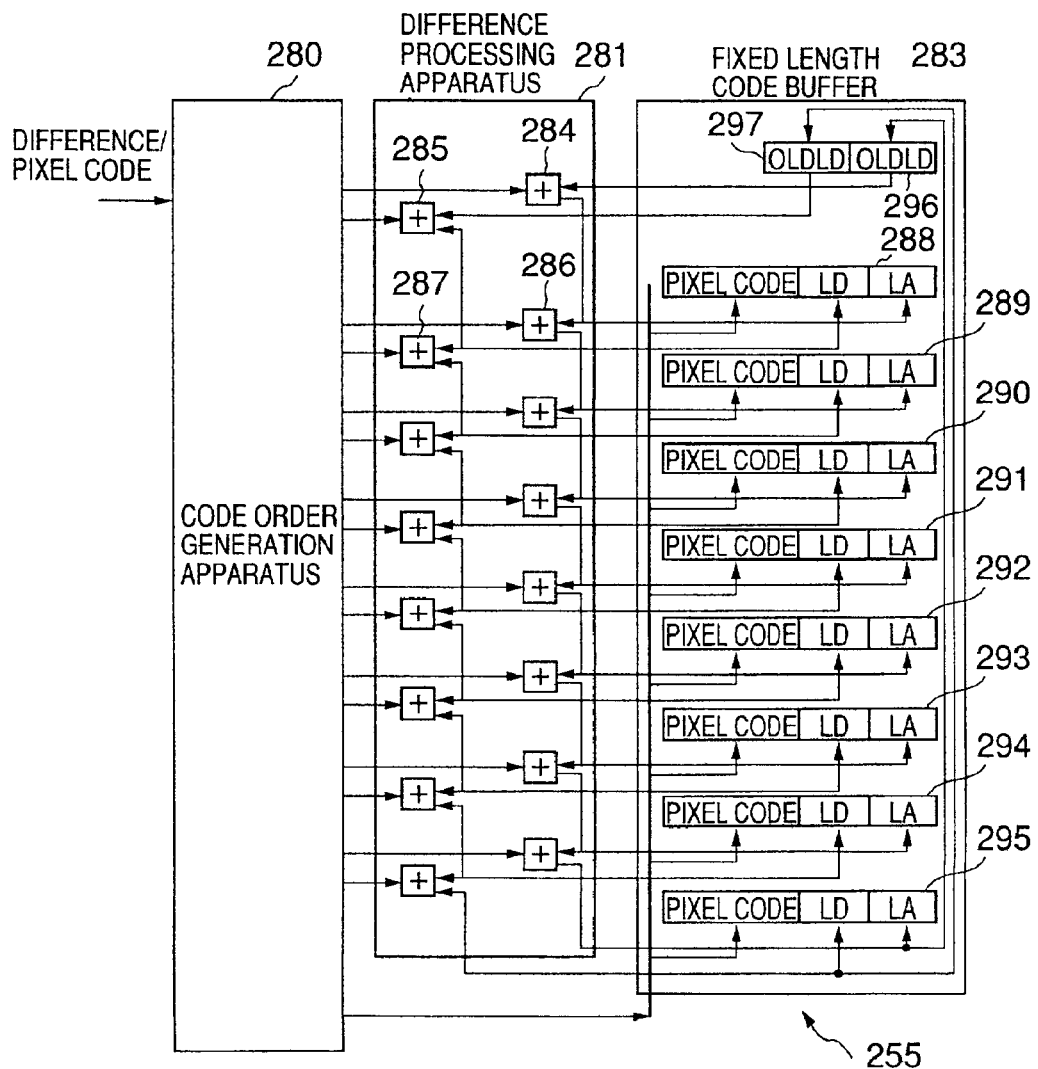
FIG. 34 is a detailed block diagram of the prediction decode processing apparatus.

FIG. 34 is a detailed block diagram of the prediction decode processing apparatus 255. In this example, GBTC is used as a fixed length encoding method. A description will now be given of the fixed length code buffer 283. Registers 288–295 store fixed length codes. Registers 296–297 store a part having a correlation with the preceding and proceeding fixed length codes of the last fixed length code of the last time. (If it is GBTC, it is the average level of the block of LA and a part of the gradation width index within block of LD.)

A description will now be given of the difference processing apparatus 281. An adder 284 performs prediction decoding of the average level of a the block of LA and the average level of the first block of LA. An adder 285 performs prediction decoding of the gradation width index within the last block of LD, and the gradation width index within the first block of LD. Similarly, an adder 286 performs prediction decoding of the average level of the first block of LA and the average level of the second block of LA. An adder 287 performs prediction decoding of the gradation width index within the second block of LD and the gradation width index within the second block of LD. Other adders shown in FIG. 34 perform prediction decoding in the same manner.

Figure 35:
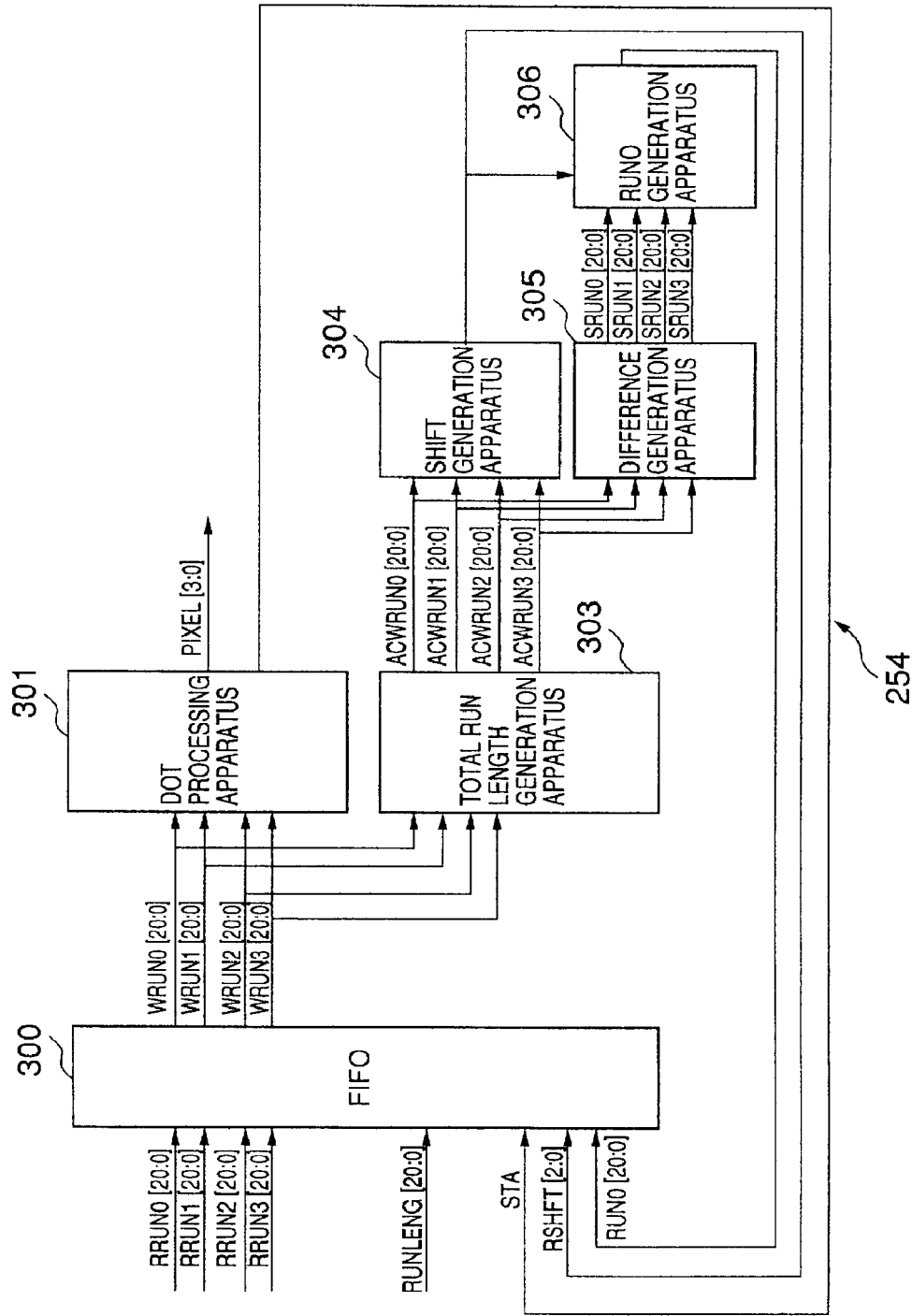
FIG. 35 is a block diagram of a dot processing apparatus.

FIG. 35 is a block diagram of the dot processing apparatus 254. The dot processing apparatus 254 receives from a FIFO 300 four run lengths and a valid number RUNLENG of the four run lengths. A dot conversion apparatus 301 converts the run lengths into dot images. A total run length generation apparatus 303 sums run lengths at each position thereof so as to determine which position of the four run lengths satisfies four dots. A shift value generation apparatus 304 finds the position in the run lengths which position satisfies four dots, and notifies the FIFO 300 of the number of the consumed run lengths so as to make a shift for a subsequent four dots.

If there is a remainder when one of the four run lengths satisfies the four dots, the difference generation apparatus 305 sends the remainder to the FIFO 300, and obtains the run length of the remainder, which is to be used as the first run length of the subsequent four run lengths. The difference generation apparatus 305 obtains differences between a total value to each run length from the total run length generation apparatus 303 and each of the four values. A RUN0 generation apparatus 306 receives the value of the actually used run from a shift generation apparatus 304, chooses RUN0, and sends it to the FIFO 300. By performing the above-mentioned process for one clock period, a pixel of four dots can be decoded for each clock.

The FIFO 300 receives the four run lengths and a valid number RUNLENG of the four run lengths from a run length generation apparatus, and sequentially stores therein. The FIFO 300 supplies the four run lengths to the dot processing apparatus 301 and the total run length generation apparatus 303. If there is a remainder when either one of the four run lengths satisfies 4 dots, the dot processing apparatus 301 notifies the FIFO 300 that there is a remainder by using an STA flag. The FIFO 300 receives the number of the consumed run lengths from the shift generation apparatus 304. Moreover, if there is a remainder when 4 dots are filled, the RUN0 generation apparatus 306 sends the remainder to the FIFO 300. Thus, the FIFO 300 receives the remainder as a run length of the first run of the subsequent set of run lengths. When there is such a remainder, the FIFO 300 outputs the stored data by performing a specified shift by setting the run length RUN0 of the remainder as the first run of the subsequent sets off run lengths.

The dot processing apparatus 301 receives four run values from the FIFO 300, and recognizes all the combinations of four runs that can fill the following four dots. The dot processing apparatus 301 generates four dots by using some runs from the beginning of the four runs. When one of the four run lengths fills four dots and there is a remainder, the dot processing apparatus 301 notifies the FIFO 300 that there is a remainder by using the STA flag.

| |
|---|
| 4, |
| 3 ,1 |
| 2 ,2 |
| 2 ,1 ,1 |
| 1 ,3 |
| 1 ,2 ,1 |
| 1 ,1 ,2 |
| 1 ,1 ,1 ,1 |

In order to judge a position where the four dots are filled in the four run lengths, the total run length generation apparatus 303 obtains the sum total of the run lengths in each location of the four runs.

ACWRUN0 expresses that the first run length is equal to the length 1. ACWRUN1=WRUN0+WRUN1 expresses that the second run length is equal to the sum of the run length 1 and the run length 2. ACWRUN2=WRUN0+WRUN1+WRUN2 expresses that the third run length is equal to the sum of the run length 1, the run length 2, and the run length 3. ACWRUN3=WRUN0+WRUN1+WRUN2+WRUN3 expresses that the third run length is equal to the sum of the run length 1, the run length 2, the run length 3 and the run length 4.

In order to find the location of the run length which fills four dots, the shift value generation apparatus 304 finds the location at which the total of the four run lengths from the total run length generation apparatus 303 exceeds the 4-dot value by giving priority to the four run lengths from the beginning. The shift value generation apparatus 304 notifies the FIFO 300 and the RUN0 generation apparatus 306 of the result of the finding.

If there is a remainder when one of the four run lengths fills 4 dots, the difference generation apparatus 305 sends the remainder to the FIFO 300. Additionally, the difference generation apparatus 305 obtains the run length corresponding to the remainder so as to use it as a first run length in the subsequent set of run lengths, and also obtains differences between a total value to each run length from the total run length generation apparatus 303 and each of the four values.

The RUN0 generation apparatus 306 receives from the difference generation apparatus 305 the value of the remainder at each of the four points, receives from the shift value generation apparatus 304 the value of the actually used runs, chooses a value from the generation apparatus 305, and sends it to the FIFO 300 as a remainder RUN0 of the last run.

As mentioned above, according to the above-mentioned embodiment of the present invention, images having different characteristics, such as a copy image and a printer image, are processed by the same image data compression apparatus, which can achieve reduction in a hardware development cost, a number of gates of the hardware and a software development cost. Moreover, the code after being compressed by a fixed length compression method (such as GBTC) can be compressed further.

The present invention is not limited to the specifically disclosed embodiments, and variations and modifications may be made without departing from the scope of the present invention.

The present application is based on Japanese priority application No. 2001-081628 filed on Mar. 21, 2001, the entire contents of which are hereby incorporated by reference.

What is claimed is:

1. An image data compression apparatus, comprising:
   a binary image data processing part which processes binary image data in accordance with a run length encoding method, said binary image data processing part including an encoding part which encodes run lengths of the binary image data by an encoding part; and
   a multiple value image data processing part which processes multiple value image data in accordance with a prediction encoding method,
   wherein said encoding part of said binary image data processing part is commonly used by said multiple image data processing part so that said encoding part compresses both the binary image data and the multiple value image data.

2. An image data compression apparatus as claimed in claim 1, wherein:
   said binary image data processing part comprises a run length processing part including:
   means for preparing a predetermined number of run lengths corresponding to a number of bits included in a plurality of bit patterns processed in parallel, and obtains a run length to be carried over to a subsequent pattern; and
   means for summing the run length to be carried over and the run lengths of the subsequent bit pattern, and
   said multiple image data processing part comprising a prediction encode processing part which receives a fixed length code of the multiple image data, and separates parameters having a high consecution correlation from a quantized code part of the fixed length code so as to apply prediction encoding only to the separated parameters to generate a plurality of prediction codes.

3. The image data compression apparatus as claimed in claim 2, wherein said encoding part comprises:
   a repeat processing part which detects a number of repeats in a plurality of runs or the prediction codes so as to generate a repeat number; and
   an encode processing part which encodes the plurality of runs or the prediction codes, the quantized code part of the fixed length code and the repeat number.

4. An image data compression apparatus for compressing multiple value image data, comprising:
   a prediction encode processing part which receives a fixed length code of the multiple image data, and separates parameters having a high consecution correlation from a quantized code part of the fixed length code so as to apply prediction encoding only to the separated parameters to generate a plurality of prediction codes;
   a repeat processing part which detects a number of repeats in the plurality of prediction codes so as to generate a repeat number; and
   an encode processing part which encodes the plurality prediction codes, the quantized code part of the fixed length code and the repeat number.

5. An image data compression method for compressing multiple value image data, the method comprising the steps of:
   receiving a fixed length code of the multiple image data;
   separating parameters having a high consecution correlation from a quantized code part of the fixed length code;
   applying prediction encoding only to the separated parameters so as to generate a plurality of prediction codes;
   detecting a number of repeats in a plurality of prediction codes so as to generate a repeat number; and
   encoding the prediction code, the quantized code part of the fixed length code and the repeat number.

* * * * *